United States Patent [19]
Usuami et al.

[11] Patent Number: 5,661,061
[45] Date of Patent: Aug. 26, 1997

[54] PROCESS FOR FABRICATING A SEMICONDUCTOR INTEGRATED CIRCUIT DEVICE HAVING THE MULTI-LAYERED FIN STRUCTURE

[75] Inventors: Hirohisa Usuami, Higashimurayama; Kazuyuki Tsunokuni, Koganei; Masayuki Kojima, Kokubunji; Kazuo Nojiri, Higashimurayama; Keiji Okamoto, Kodaira, all of Japan

[73] Assignees: Hitachi, Ltd.; Hitachi ULSI Engineering Corporation, both of Tokyo, Japan

[21] Appl. No.: 411,149

[22] Filed: Mar. 27, 1995

[30] Foreign Application Priority Data

Mar. 25, 1994 [JP] Japan .................. 6-055812

[51] Int. Cl.⁶ .................. H01L 21/70; H01L 27/00
[52] U.S. Cl. .................. 438/254; 438/397
[58] Field of Search .................. 437/52, 60, 919

[56] References Cited

U.S. PATENT DOCUMENTS 5,273,925  12/1993  Yamanaka .................. 437/52
5,290,726   3/1994  Kim .................. 437/52
5,336,638   8/1994  Suzuki et al. .................. 437/52

*Primary Examiner*—Jey Tsai
*Attorney, Agent, or Firm*—Antonelli, Terry, Stout & Kraus, LLP

[57] ABSTRACT

A process for forming an upper-layer fin and a lower-layer fin of a storage electrode, and a semiconductor integrated circuit device fabricated by the process. When two-layered polycrystalline silicon films are to be sequentially etched to form the upper-layer fin and the lower-layer fin by the dry-etching method using a first mask, the upper polycrystalline silicon film is patterned at first so far as to form the clearance of the upper-layer fins with the minimum working size of the memory cells of a DRAM, to form the upper-layer fin. Next, the lower-layer fin is formed by the dry-etching method using a second mask which has a pattern enlarged in self-alignment from the pattern of the first mask, so that it is given a larger horizontal size than that of the upper-layer fin.

13 Claims, 26 Drawing Sheets

PROCESS FOR FABRICATING A SEMICONDUCTOR INTEGRATED CIRCUIT DEVICE HAVING THE MULTI-LAYERED FIN STRUCTURE

BACKGROUND OF THE INVENTION

The present invention relates to a semiconductor integrated circuit device and a technique for fabricating the device and, more particularly, to a technique which is effective when applied to a semiconductor integrated circuit device having a DRAM (i.e., Dynamic Random Access Memory) equipped with an information storing capacity element (or capacitor) having the multi-layered fin structure.

A large-capacity DRAM of recent years has adopted the stack structure, in which the information storing capacity element is arranged over the memory cell selecting MISFET, so as to compensate such a reduction of the quantity (Cs) of stored electric charge of the information storing capacity element as occurs according to the fine structure of the memory cells. Above all, the DRAM having the multi-layered fin structure in the storage electrode of the information storing capacity element has its application promoted to a larger capacity on and after 16 Mbits, because its surface area can be remarkably enlarged.

The DRAM having the information storing capacity element of the aforementioned multi-layered fin structure is exemplified in the prior art by Japanese Patent Laid-Open No. 53262/1992. The DRAM, as disclosed in this Laid-Open, is formed with three-layered fins in the storage electrode of the information storing capacity element. In this DRAM, moreover, the clearance between the storage electrode and the storage electrode of an adjoining memory cell is made narrower in the lower-layer fin and wider in the upper-layer fin so that the inter-layer insulating film to be deposited in that clearance may be cleared of any "void" to improve the reliability of the DRAM.

In order to form the aforementioned three-layered fins, a photoresist is formed over three-layered polycrystalline silicon films deposited across the inter-layer insulating film and is formed in its portion with a hole, and the uppermost polycrystalline silicon film exposed to the bottom of that hole is isotropically etched with an etching liquid to form the uppermost-layer fin.

Next, the inter-layer insulating film between the uppermost-layer fin and the second-layered polycrystalline silicon film is formed with a hole, and the second-layered polycrystalline silicon film exposed to the bottom of that hole is isotropically etched with an etching liquid to form a second-layer fin.

Subsequently, the inter-layer insulating film between the second-layer fin and the uppermost polycrystalline silicon film is formed with a hole by a method similar to the aforementioned one, and the lowermost polycrystalline silicon film exposed to the bottom of that hole is isotropically etched with an etching liquid to form a lowermost-layer fin. After this, the inter-layer insulating films left between the individual fins are etched off to form the storage electrode having the three-layered fins.

According to the process described above, the uppermost polycrystalline silicon film (or fin) is exposed to the etching liquid for a longer time period than the lower polycrystalline silicon films (or fins) so that its sides are more etched. As a result, there is attained the storage electrode in which the clearance between the fins of the adjoining memory cells is the wider for the upper fins.

SUMMARY OF THE INVENTION

As the degree of integration of the DRAM advances to make the minimum working size of the element finer, there is required a technique for enlarging the surface area of the information storing capacity element of the stack structure. In the case of the information storing capacity element of the aforementioned multi-layered fin structure, it is effective means for increasing the surface area to increase the layer number of the fins or to widen the fins horizontally.

However, the increase in the fin layer number will not only increase the number of steps of forming the information storing capacity element but also enlarge the step between the portions with and without the fins, thus making it difficult to work the wiring lines which are formed over the information storing capacity element.

Moreover, there is a limit to the horizontal widening of the fins. The storage electrode having the multi-layered fins is formed, as described above, by forming the hole in the photoresist (or inter-layer insulating film) over the polycrystalline silicon film and by wet-etching the polycrystalline silicon film which is exposed to the bottom of the hole. However, the hole cannot have its diameter made smaller than the design rule of the DRAM, i.e., the minimum working size of the element, so that the clearance between the fins of the adjoining memory cells cannot be smaller than that minimum working size.

According to the aforementioned fin forming process, moreover, the wet-etching method having a lower etching controllability than the dry-etching method is employed for etching the polycrystalline silicon film to form the fins, so that the fins are difficult to form in a high sizing accuracy.

An object of the present invention is to provide a technique capable of increasing the surface area of an information storing capacity element having the multi-layered fin structure and retaining a sufficient quantity of stored electric charge even in case the DRAM is made finer.

Another object of the present invention is to provide a technique capable of achieving the above-specified object and forming the information storing capacity element having the multi-layered fin structure in a high sizing accuracy.

The aforementioned and other objects and novel features of the present invention will become apparent from the following description to be made with reference to the accompanying drawings.

Representatives of the invention to be disclosed herein will be briefly summarized in the following.

According to an aspect of the present invention, there is provided a semiconductor integrated circuit device comprising: a plurality of word lines; a plurality of data lines intersecting the word lines and a plurality of memory cells connected with the word lines and the data lines, each of the memory cells comprising:

a memory cell selecting MISFET including source and drain regions formed over the principal surface of a semiconductor substrate, and a gate electrode formed between the source and drain regions over the semiconductor substrate through an insulating film; and an information storing capacity element including: a storage electrode having a first conductive film formed over the gate electrode and said first conductive film having a second pattern, and a second conductive film electrically connected with the first conductive film and having a first pattern positioned over the first conductive film, the storage electrode being electrically connected with one of the source and drain regions of the memory cell selecting MISFET; a dielectric film cover in the surface of the storage electrode; and a plate electrode formed over the storage electrode through the dielectric film, wherein the first conductive film has a smaller clearance than that of the second conductive film in the adjoining ones of the memory cells, and wherein the second conductive film has a clearance substantially equal to the minimum working size of the semiconductor integrated circuit device in the two memory cells which are adjacent to each other in the extend indirection of the word lines.

According to another aspect of the present invention, there is provided a process for fabricating a semiconductor integrated circuit device having a plurality of memory cells, each of which comprises: a memory cell selecting MISFET including source and drain regions formed over a semiconductor substrate, and a gate electrode; and an information storing capacity element including a storage electrode having a first conductive film formed over the gate electrode and a second conductive film electrically connected with the first conductive film and positioned over the first conductive film, and electrically connected one of the source and drain regions of the memory cell selecting MISFET, a dielectric film covering the surface of the storage electrode, and a plate electrode formed over the storage electrode through the dielectric film, comprising:

the step of forming the memory cell selecting MISFET over the semiconductor substrate;

the step of forming an insulating film over the gate electrode of the memory cell selecting MISFET;

the step of forming the first conductive film over the insulating film;

the step of forming the second conductive film over the first conductive film such that the second conductive film is spaced excepting at least a portion from the first conductive film;

the step of forming a first mask having the first pattern over the second conductive film;

the step of removing the second conductive film of the portion, which is not covered with the first mask, in self-alignment with the first mask;

the step of forming the second mask having the second pattern enlarged in self-alignment with the first pattern of the first mask;

the step of removing the first conductive film of the portion, which is not covered with the second mask, in self-alignment with the second mask;

the step of forming the dielectric film to cover the surface of the storage electrode; and the step of forming the plate electrode over the storage electrode through the dielectric film.

According to still another aspect of the present invention, there is provided a process for fabricating a semiconductor integrated circuit device which an information storing capacity element including a storage electrode having multi-layered fins, a dielectric film covering the surface of the storage electrode, and a plate electrode formed over the storage electrode through the dielectric film is formed over a memory cell selecting MISFET, comprising the steps of:

(a) depositing a first insulating film over the memory cell selecting MISFET and then etching the first insulating film, to form a first connection hole extending to one semiconductor region of the memory cell selecting MISFET;

(b) depositing a first conductive film over the first insulating film to connect the first conductive film and the one semiconductor region of the memory cell selecting MISFET electrically through the first connection hole;

(c) depositing a second insulating film over the first conductive film and then etching the second insulating film, to form a second connection hole leading to the first conductive film;

(d) depositing a second conductive film over the second insulating film to connect the second conductive film and the first conductive film electrically through the second connection hole;

(e) patterning the second conductive film by using a first mask having a first pattern formed over the second conductive film, to form an upper-layer fin;

(f) patterning the second insulating film so that the second insulating film may have a second pattern extended in self-alignment with the first pattern, to form a second mask;

(g) patterning the first conductive film, which is formed below the second insulating film, in self-alignment with the second mask, to form a lower-layer fin; and (h) etching off the second insulating film, which is left between the upper-layer fin and the lower-layer fin, to form a storage electrode of the information storing capacity element, which has the upper-layer fin and the lower-layer fin.

According to a further aspect of the present invention, there is provided a process for fabricating a semiconductor integrated circuit device which an information storing capacity element including a storage electrode having multi-layered fins, a dielectric film covering the surface of the storage electrode, and a plate electrode formed over the storage electrode through the dielectric film is formed over a memory cell selecting MISFET, comprising the steps of:

(a) depositing a first insulating film over the memory cell selecting MISFET and then etching the first insulating film, to form a first connection hole extending to one semiconductor region of the memory cell selecting MISFET;

(b) depositing a first conductive film over the first insulating film to connect the first conductive film and the one semiconductor region of the memory cell selecting MISFET electrically through the first connection hole;

(c) depositing a second insulating film over the first conductive film and then etching the second insulating film, to form a second connection hole leading to the first conductive film;

(d) depositing a second conductive film over the second insulating film to connect the second conductive film and the first conductive film electrically through the second connection hole;

(e) patterning the second conductive film and the second insulating film by using a first mask formed over the second conductive film, to form an upper-layer fin;

(f) depositing a third insulating film over the first mask and then etching the third insulating film to leave the third insulating film on the individual side walls of the upper-layer fin and the second insulating film;

(g) patterning the first conductive film in self-alignment with the third insulating film, to form a lower-layer fin; and (h) etching off the second insulating film, which is left between the upper-layer fin and the lower-layer fin, to form a storage electrode of the information storing capacity element, which has the upper-layer fin and the lower-layer fin.

According to a further aspect of the present invention, there is provided a process for fabricating a semiconductor integrated circuit device which an information storing capacity element including a storage electrode having multi-layered fins, a dielectric film covering the surface of the storage electrode, and a plate electrode formed over the storage electrode through the dielectric film is formed over a memory cell selecting MISFET, comprising the steps of:

(a) depositing a first insulating film, a first conductive film and a second insulating film sequentially over the memory cell selecting MISFET and then etching the second insulating film, the first conductive film and the first insulating film, to form a connection hole extending to one semiconductor region of the memory cell selecting MISFET;

(b) depositing a second conductive film over the second insulating film to connect the second conductive film and the one semiconductor region of the memory cell selecting MISFET electrically through the connection hole;

(c) patterning the second conductive film by using a first mask formed over the second conductive film, to form an upper-layer fin;

(d) etching off the second insulating film from below the upper-layer fin, then depositing a third insulating film over the first mask and subsequently etching the third insulating film, to leave the third insulating film on the individual side walls of the first mask and the upper-layer fin; and (e) patterning the first conductive film in self-alignment with the third insulating film, which is left on the individual side walls of the photoresist and the upper-layer fin, to form a lower-layer fin.

According to a further aspect of the present invention, there is provided a process for fabricating a semiconductor integrated circuit device which an information storing capacity element including a storage electrode having multi-layered fins, a dielectric film covering the surface of the storage electrode, and a plate electrode formed over the storage electrode through the dielectric film is formed over a memory cell selecting MISFET, comprising the steps of:

(a) depositing a first insulating film over the memory cell selecting MISFET and then etching the first insulating film, to form a first connection hole extending to one semiconductor region of the memory cell selecting MISFET;

(b) depositing a first conductive film over the first insulating film to connect the first conductive film and the one semiconductor region of the memory cell selecting MISFET electrically through the first connection hole;

(c) depositing a second insulating film over the first conductive film and then etching the second insulating film, to form a second connection hole leading to the first conductive film;

(d) depositing a second conductive film over the second insulating film to connect the second conductive film and the first conductive film electrically through the second connection hole;

(e) patterning the second conductive film to taper its side walls by using a first mask formed over the second conductive film, to form an upper-layer fin;

(f) patterning the second insulating film, which is formed below the upper-layer fin, to taper its side wall in self-alignment with the first mask;

(g) patterning the first conductive film, which is formed below the second insulating film, by using the first mask and the second insulating film as the mask, to form a lower-layer fin; and (h) etching off the second insulating film, which is left between the upper-layer fin and the lower-layer fin, to form a storage electrode of the information storing capacity element, which has the upper-layer fin and the lower-layer fin.

According to a further aspect of the present invention, there is provided a process for fabricating a semiconductor integrated circuit device having a plurality of memory cells, each of which comprises: an information storing capacity element including a storage electrode having at least two conductive layers electrically connected with each other, a dielectric film covering the storage electrode, and a common electrode formed over the storage electrode through the dielectric film; and a memory cell selecting MISFET, comprising the steps of:

(a) forming a gate electrode of the memory cell selecting MISFET over the surface of a semiconductor substrate and first and second semiconductor regions, which form the source region and the drain region of the memory cell selecting MISFET, in the semiconductor substrate at the two sides of the gate electrode;

(b) forming a first conductive film over the semiconductor substrate to form a storage electrode;

(c) depositing a first insulating film over the first conductive film;

(d) depositing a second conductive film over the first insulating film;

(e) patterning the second conductive film by using a first mask formed over the second conductive film, to form a plurality of uppermost conductive layers;

(f) patterning the first insulating film by using the first mask;

(g) forming a second insulating film on the side walls of the patterned first insulating film; and (h) patterning the first conductive film in self-alignment with the second insulating film, wherein the plurality of uppermost conductive layers are worked with the minimum working size.

According to a further aspect of the present invention, the lower-layer fin of the storage electrode is formed by the etching method using the first and second masks so that it is given a larger horizontal size than that of the upper-layer fin which is formed by using only the first mask. Since, moreover, the clearance of the upper-layer fins of the adjoining memory cells is substantially equal to the minimum working size of the memory cells of the DRAM, the clearance between the lower-layer fins of the adjoining memory cells is smaller than that minimum working size.

According to a further aspect of the present invention, the fins of the storage electrode are formed by patterning the polycrystalline silicon film by the dry-etching method so that they can be formed in a higher sizing accuracy than that of the case in which the fins are formed by patterning the polycrystalline silicon film by the wet-etching method.

According to a further aspect of the present invention, since the insulating film hard to etch with the etching liquid of hydrofluoric aid is formed between the lower-layer fin and the memory cell selecting MISFET below the former, it is possible to prevent a disadvantage that the semiconductor substrate has its surface scraped with the etching liquid to be used at the step of forming the storage electrode.

DESCRIPTION OF THE PREFERRED EMBODIMENTS

Figure 1:
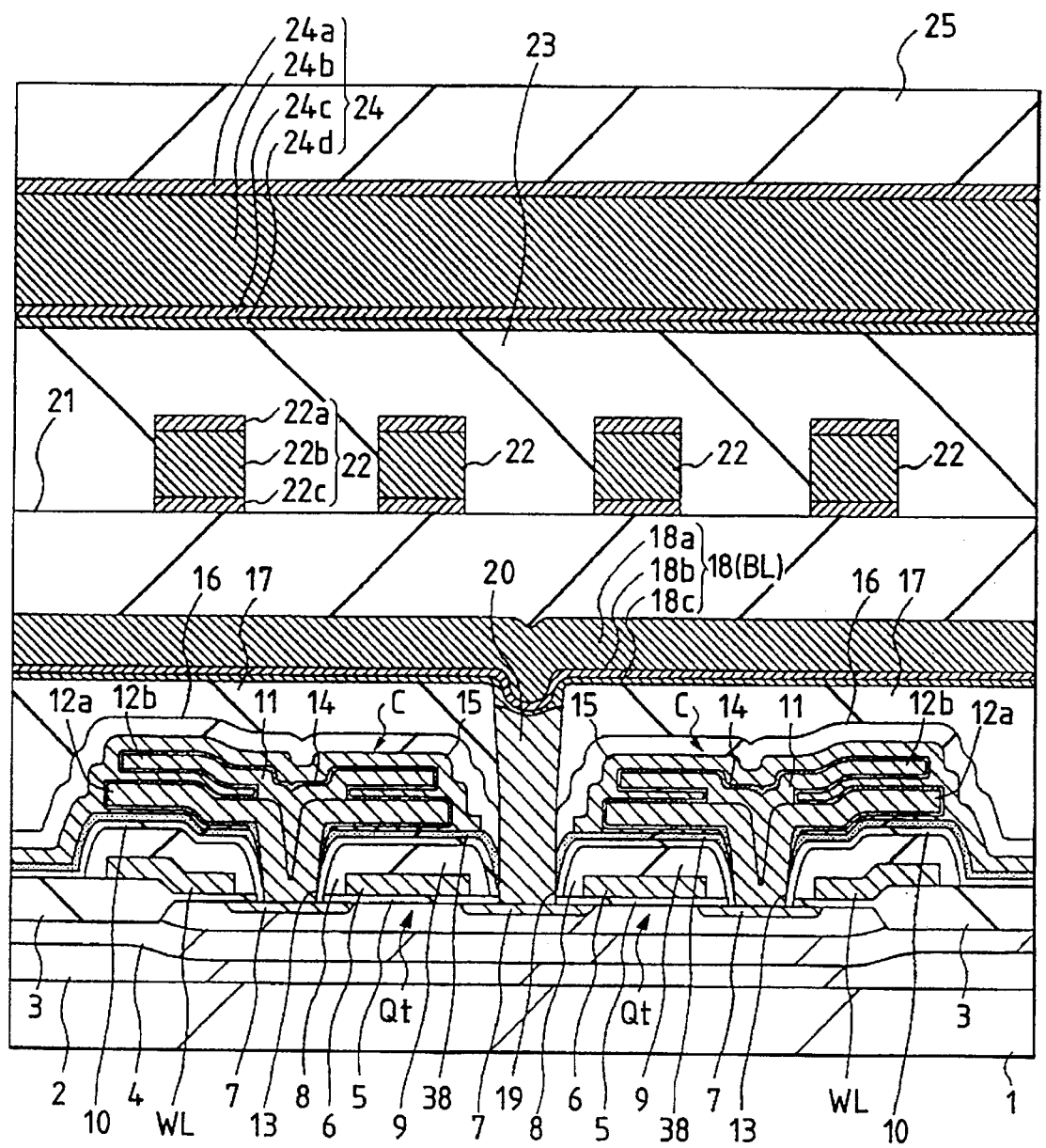
FIG. 1 is a section of an essential portion of a semiconductor substrate and shows a memory cell of a DRAM according to one embodiment of the present invention.

The present invention will be described in detail in the following in connection with its embodiments with reference to the accompanying drawings. Incidentally, the portions having identical functions will be designated at common reference numerals throughout the drawings, and their repeated description is avoided.

[Embodiment 1]

Figure 2:
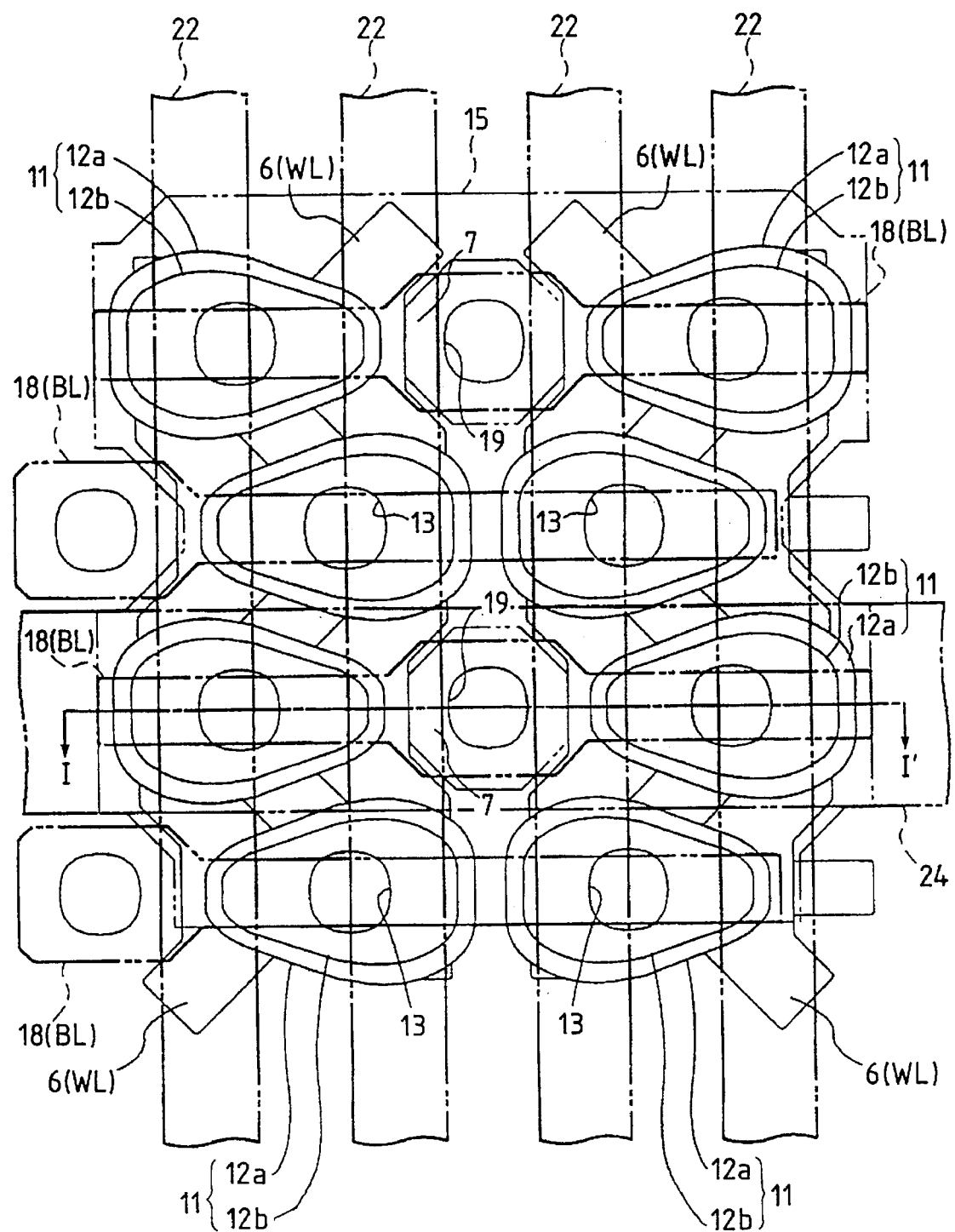
FIG. 2 is a top plan view showing a layout of the individual conductive layers of the memory cell of the DRAM according to one embodiment of the present invention.

FIG. 1 is a section of an essential portion of a semiconductor substrate and shows (about two) memory cells of a DRAM according to one embodiment of the present invention, and FIG. 2 is a top plan view showing the individual conductive layers of the memory cells shown in FIG. 1. Incidentally, FIG. 1 is a section taken along line I-I' of FIG. 2.

A semiconductor substrate 1 made of $p^-$-type single crystalline silicon is formed over its principal surface with a p-type well 2, which has its inactive region formed over its principal surface with an element separating field insulating film 3 made of silicon oxide. In the p-type well 2 below the field insulating film 3, moreover, there is formed a p-type channel stopper region 4.

The memory cell of the DRAM is formed over the principal surface of the active region of the p-type well 2, which is enclosed by the aforementioned field insulating film 3. This memory cell is constructed to include: a memory cell selecting MISFET Qt of an n-channel type; and an information storing capacity element (or capacitor) C arranged over the memory cell selecting MISFET.

This memory cell selecting MISFET Qt is composed of a gate insulating film 5, a Gate electrode 6 and a pair of n-type semiconductor regions 7 and 7 (i.e., source region and drain region). The gate electrode 6 is formed of a first-layered polycrystalline silicon film to acts a word line WL. This polycrystalline silicon film forming the gate electrode 6 (and the word line WL) is doped with an n-type impurity (e.g., P) for reducing resistance. Incidentally, the gate electrode 6 (and the word line WL) may be made of a polycide film which is prepared by laminating films of refractory metal silicides such s $WSi_x$, $MoSi_x$, $TiSi_x$ or $TaSi_x$ over the polycrystalline silicon film.

A side wall spacer 8 is formed in the side walls, as taken in the gate direction, of the aforementioned gate electrode 6. Over this gate electrode 6, moreover, there is formed an insulating film 9. These side wall spacer 8 and insulating film 9 are overlaid by an insulating film 10, over which an insulating film 38 is formed. All of these side wall spacer 8, insulating film 9 and insulating film 20 are made of silicon oxide. On the other hand, the insulating film 38 is made of silicon nitride and functions as an anti-etching film for protecting the memory selecting MISFET Qt from the etching liquid which is used at a step of forming storage electrodes, as will be described in the following.

Over the aforementioned insulating film 38, there is formed the storage electrode 11 for the information storing capacity element C. This storage electrode 11 is formed with: a first-layered (or lower-layer) fin 12 extending to cover the gate electrode 6 of the memory selecting MISFET Qt; and a second-layered (or upper-layer) fin 12b formed over the former fin and extending to cover the fin 12a. The lower-layer fin 12a is made of a second-layered polycrystalline silicon film, and the upper-layer fin 12b is made of a third-layered polycrystalline silicon film. These polycrystalline silicon films are doped with an n-type impurity (e.g., P) for reducing their resistances.

Of the two layer fins 12a and 12b forming part of the storage electrode 11, the lower-layer fin 12a is connected with one semiconductor region 7 of the memory cell selecting MISFET Qt through a connection hole 13 which is formed in the insulating film 38, the insulating film 10 and an insulating film (which is formed at the same step as that of the gate insulating film 5). As shown, this fin 12a has a larger horizontal size than that of the upper-layer fin 12b. In other words, this storage electrode 11 is formed to have such a clearance from the storage electrode 11 of the adjoining memory cell as is smaller at the lower-layer fin 12a and larger at the upper-layer fin 12b.

Figure 3:
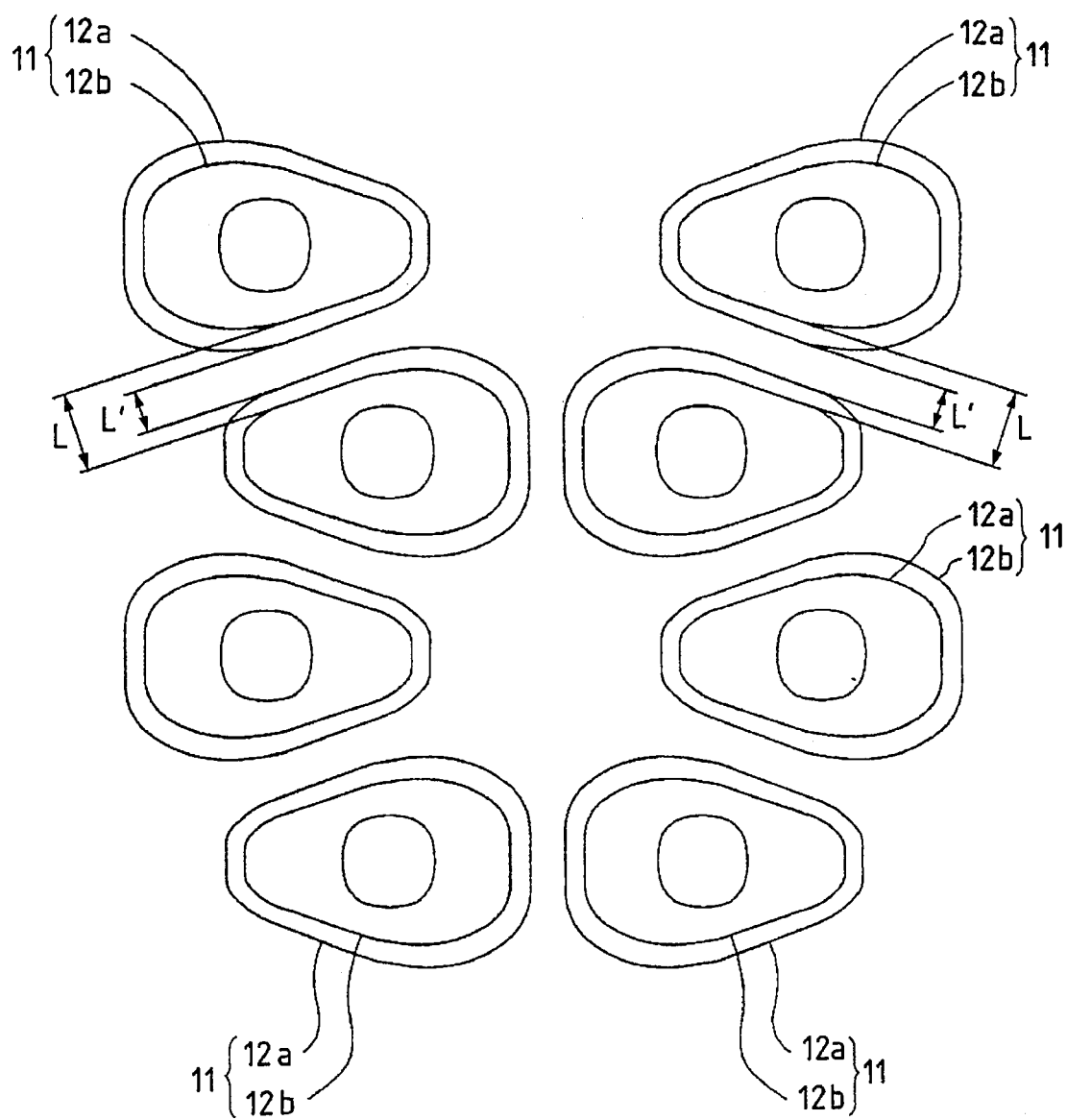
FIG. 3 is a top plan view showing a layout of storage electrodes of the memory cell of the DRAM according, to one embodiment of the present invention.

As shown in FIG. 3, moreover, the storage electrode 11 described above is formed such that the clearance (L) between the upper-layer fin 12b thereof and the upper-layer fin 12b of the storage electrode 11 of the memory cell adjacent thereto in the extending direction of the word line WL is substantially equal to the minimum working size of the memory cells of this DRAM. Since the lower-layer fin 12a is given a larger horizontal size than that of the upper-layer fin 12b, as described above, the clearance (L') between the lower-layer fin 12a of the storage electrode 11 under consideration and the lower-layer fin 12a of the adjoining storage electrode 11 is made smaller than that minimum working size.

Thus, in the DRAM of the present embodiment, the horizontal size of the lower-layer fan 12a of the storage electrode 11 is made larger than that of the upper-layer fin 12b, and the clearance between that fin 12a and the lower-layer fin 12a of the adjoining storage electrode 11 is made smaller than the minimum working size of the memory cell of this DRAM. Thanks to this construction, the storage electrode 11 can have its surface area increased according to the increase in the horizontal size of the lower-layer fin 12a thereby to increase the quantity (Cs) of stored electric charge of the information storing capacity element C.

Over the aforementioned storage electrode 11, there is formed a plate electrode 15 of the information storing capacity element C across a dielectric film 14. This dielectric film 14 is formed of a silicon nitride film, and the plate electrode 15 is formed of a fourth-layered polycrystalline silicon film. This polycrystalline silicon film is doped with an n-type impurity (e.g., P) for reducing its resistance.

Over the aforementioned information storing capacity element C, there is formed through both an insulating film 16 of silicon oxide and an overlying inter-layer insulating film 17 of BPSG (i.e., Boro-Phospho Silicate Glass) a first wiring layer 18 forming a bit line BL. This first wiring layer 18 is composed of a W layer (upper layer) 18a, a TiN layer (intermediate layer) 18b and a Ti layer (lower layer) 18c, and is connected with one n-type semiconductor region 7 of the memory cell selecting MISFET Qt through a connection hole 19 which is formed in the inter-layer insulating film 17 and the insulating film 16. Incidentally, since this connection hole 19 is given a large aspect ratio (i.e., a ratio of height to diameter of the hole), it has a polycrystalline silicon film 20 buried therein to improve the connection reliability between the first wiring layer 18 and the n-type semiconductor region 7.

Over the aforementioned first wiring layer 18 (or bit line BL), there is formed a second wiring layer 22 through an inter-layer insulating film 21. This inter-layer insulating film 21 is formed of laminated films of silicon oxide, spin-on glass and silicon oxide. The second wiring layer 22 forms a main word line and is formed of laminated films of a TiN layer (upper layer) 22a, an Al layer (intermediate layer) 22b and a Ti layer (lower layer) 22c.

Over the aforementioned second wiring layer 22, there is formed a third wiring layer 24 through an inter-layer insulating film 23. This inter-layer insulating film 23 is formed of laminated films of silicon oxide, spin-on glass and silicon oxide. The third wiring layer 24 forms a columns elect line and is formed of laminated films of a lower Ti layer 24d, an overlying TiN layer 24c, an overlying Al layer 24b and the uppermost TiN layer 24a. Over this third wiring layer 24, i.e., in the uppermost layer of the semiconductor substrate 1, there is formed a passivation film 25 which is formed of laminated films of silicon oxide and silicon nitride.

With reference to FIGS. 4 to 24, here will be described one example of a fabrication process of the memory cell of the DRAM thus constructed according to the present embodiment.

Figure 4:
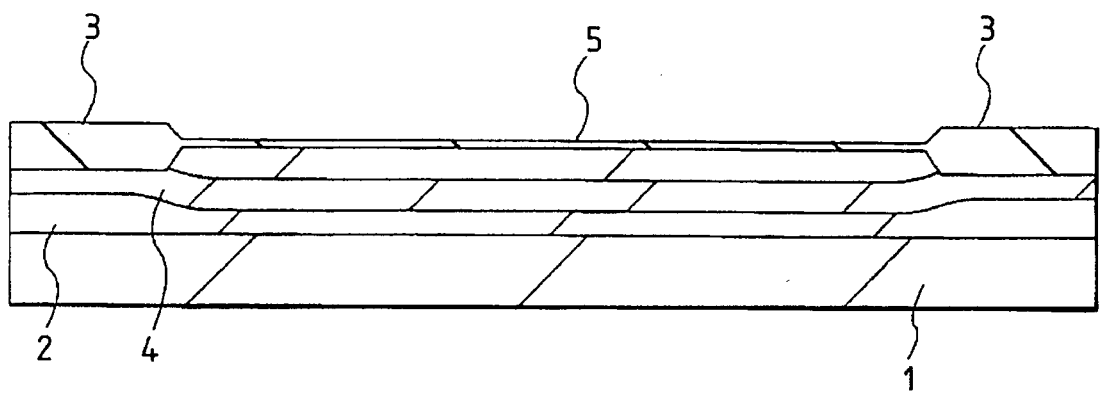
FIG. 4 is a section of an essential portion of the semiconductor substrate and shows a fabrication process of the memory cell of the DRAM according to one embodiment of the present invention.

First of all, as shown in FIG. 4, the semiconductor substrate 1 is formed on its principal surface sequentially with the p-type well 2, the field insulating film 3 and the gate insulating film 5 by the well-known method. After this, the p-type well 2 is doped with the ions of a p-type impurity (e.g., boron), which are extended and diffused to form the p-type channel stopper region 4.

Figure 5:
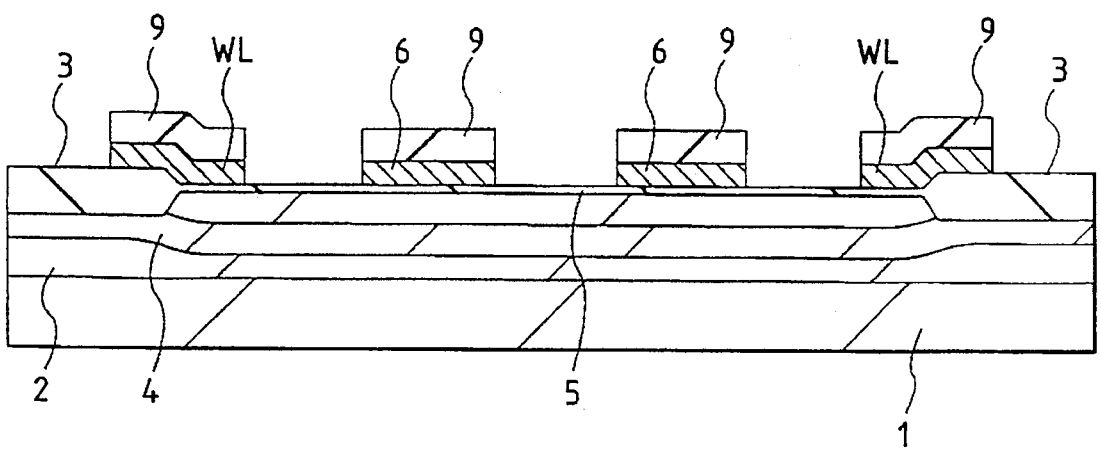
FIG. 5 is a section of an essential portion of the semiconductor substrate and shows a fabrication process of the memory cell of the DRAM according to one embodiment of the present invention.
Figure 6:
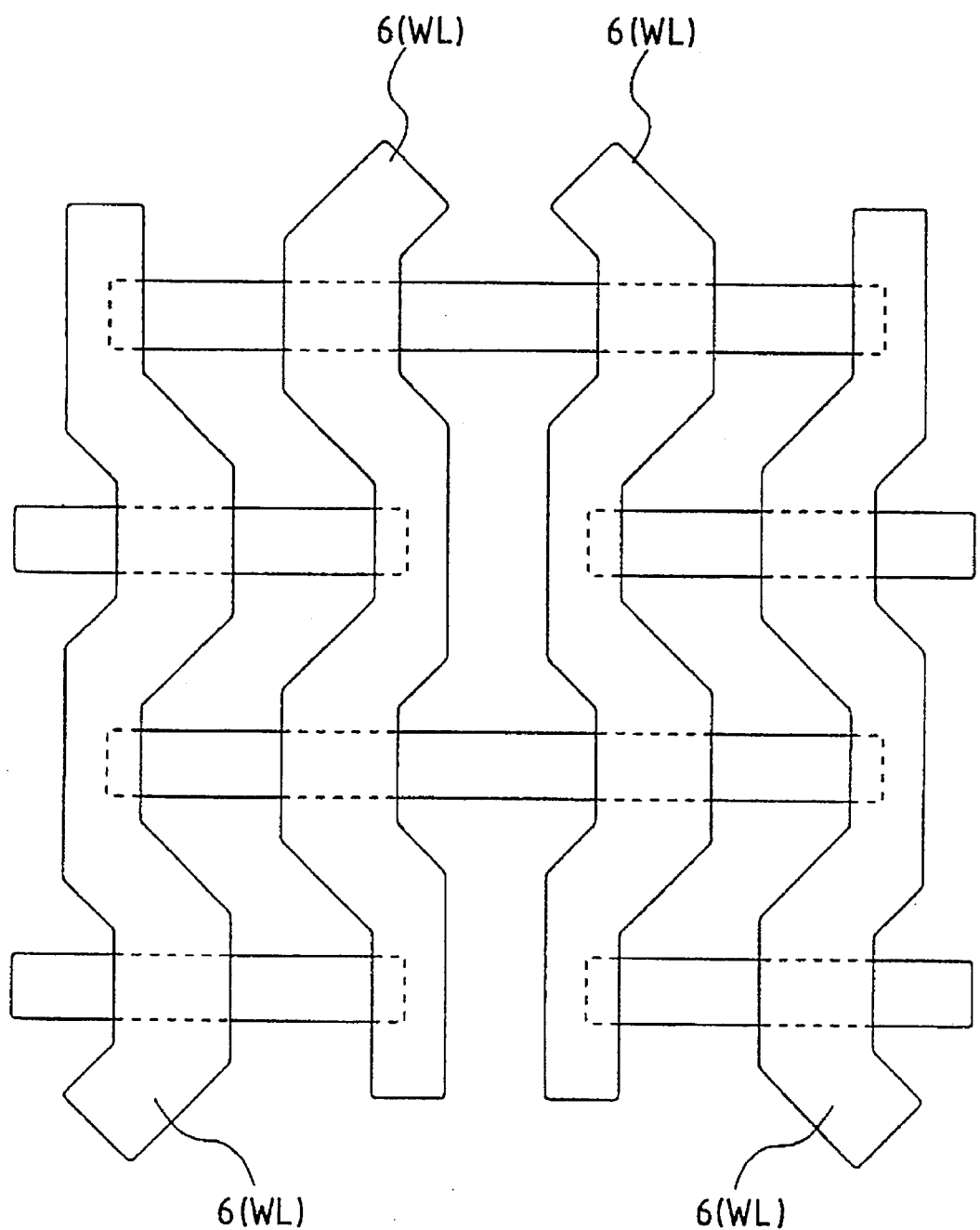
FIG. 6 is a top plan view showing a layout of gate electrodes of the memory cell of the DRAM according to one embodiment of the present invention.

Next, the first-layered polycrystalline silicon film (having a thickness of 150 to 250 nm) and the silicon oxide film (having a thickness of 200 to 300 nm) are sequentially deposited on the semiconductor substrate 1 by the CVD method and are patterned by the dry-etching method using a photoresist as the mask, to form the gate electrodes 6 (and the word lines WL) of the memory cell selecting MISFET Qt of the aforementioned first-layered polycrystalline silicon film, as shown in FIGS. 5 and 6.

Figure 7:
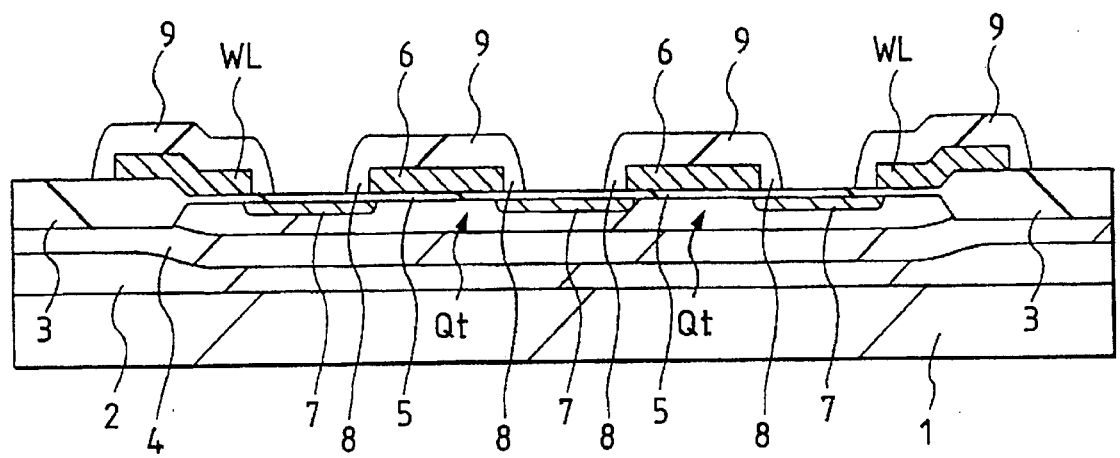
FIG. 7 is a section of an essential portion of the semiconductor substrate and shows a fabrication process of the memory cell of the DRAM according to one embodiment of the present invention.

Next, as shown in FIG. 7, the p-type well 2 is doped with the ions of an n-type impurity phosphor) in a dosage of 2 to 5 $10^{13}$/cm$^2$ to form the n-type semiconductor regions 7 and 7 (for the source region and the drain region) of the memory cell selecting MISFET Qt. After this, the silicon oxide film (having a thickness of 100 to 200 nm) deposited over the semiconductor substrate 1 by the CVD method is anisotropically etched by the RIE (Reactive Ion Etching) method to form the side wall spacers 8 on the gate length side walls of the gate electrodes 6.

Figure 8:
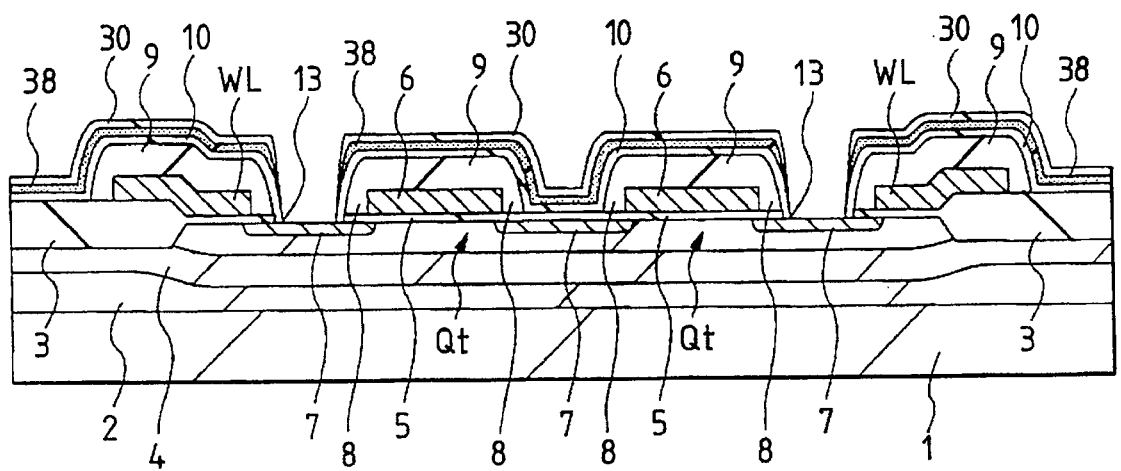
FIG. 8 is a section of an essential portion of the semiconductor substrate and shows a fabrication process of the memory cell of the DRAM according to one embodiment of the present invention.
Figure 9:
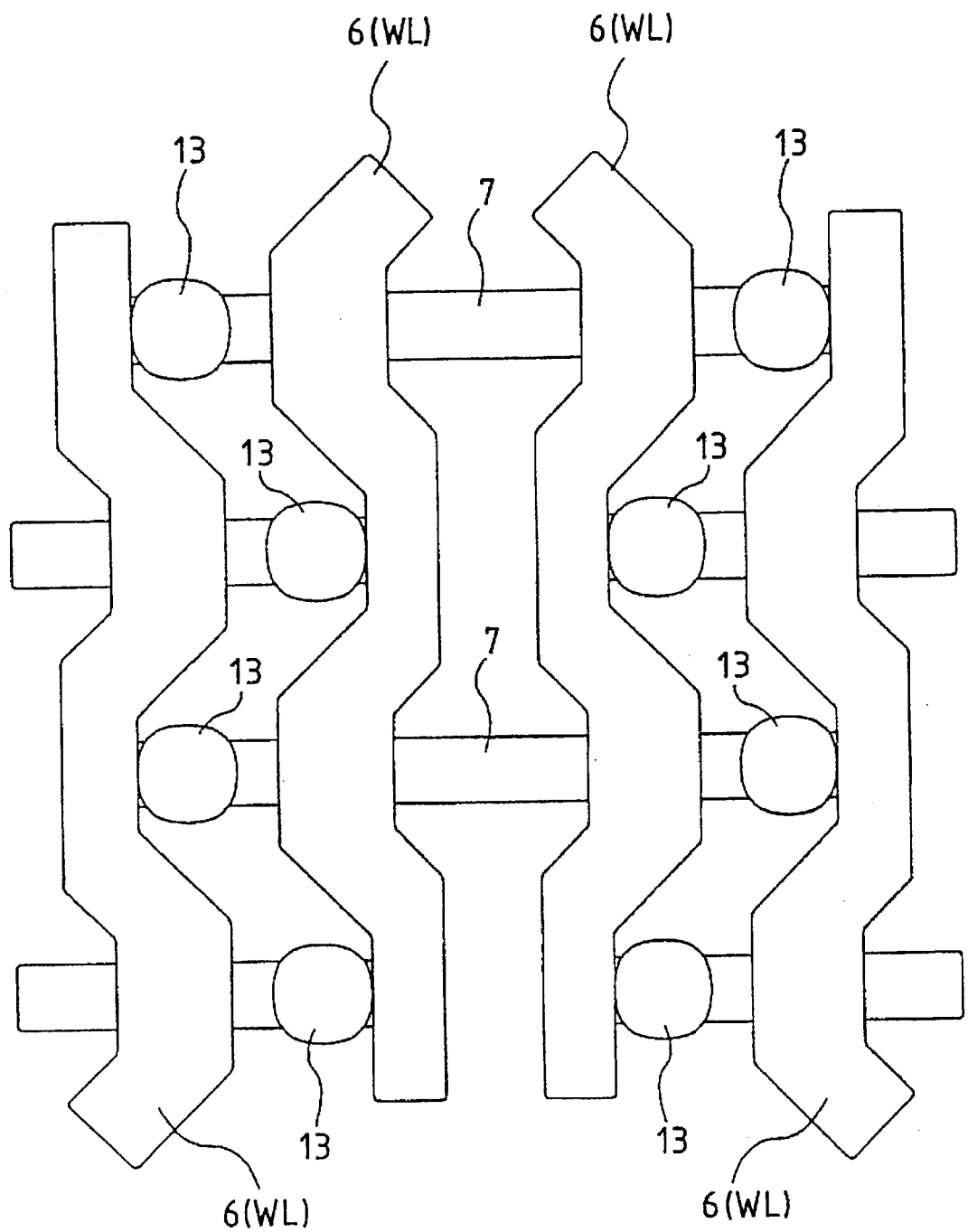
FIG. 9 is a top plan view showing a layout of connection holes of the memory cell of the DRAM according to one embodiment of the present invention.

Next, there are sequentially deposited on the semiconductor substrate 1 by the CVD method the insulating film 10 (having a thickness of 50 nm) of silicon oxide, the insulating film 38 (having a thickness of 50 nm) of silicon nitride, and an insulating film 30 (having a thickness of 50 to 100 nm) of silicon oxide. After this, these insulating films 10, 38 and 30 and the insulating film (i.e., the insulating film formed at the same step as that of the gate insulating film 5) are dry-etched to form the connection hole 13 leading to one semiconductor region 7 of the memory cell selecting MISFET Qt, as shown in FIGS. 8 and 9.

Figure 10:
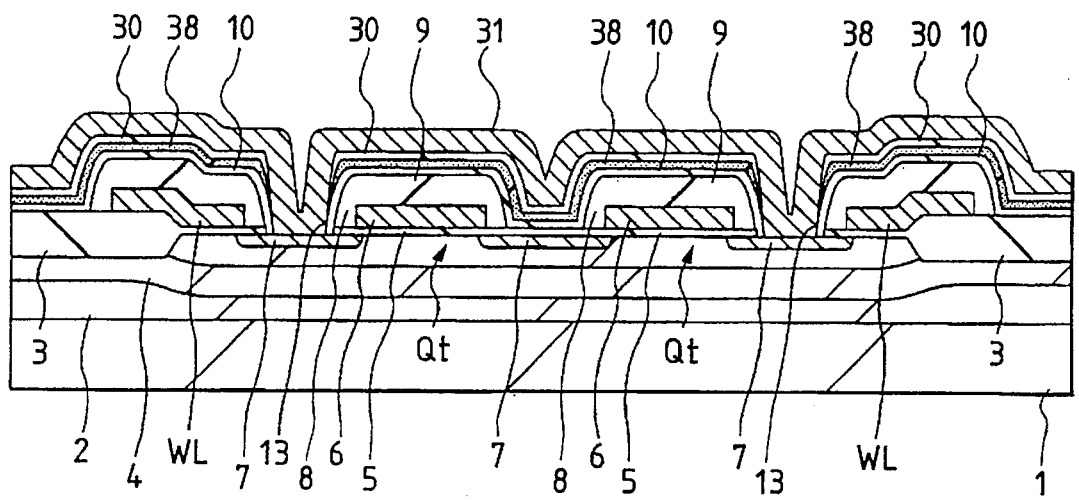
FIG. 10 is a section of an essential portion of the semiconductor substrate and shows a fabrication process of the memory cell of the DRAM according to one embodiment of the present invention.

Next, as shown in FIG. 10, a second-layered polycrystalline silicon film 31 (having a thickness of 100 to 200 nm) is deposited by the CVD method over the whole surface of the semiconductor substrate 1 including the inside of the aforementioned connection hole 13. This polycrystalline silicon film 31 forms part of the storage electrode 11 of the information storing capacity element C and is doped with an n-type impurity (e.g., phosphor) in a dosage of 2 to 3×10$^{20}$/cm$^3$ until it is connected through the aforementioned connection hole 13 with one semiconductor region 7 of the memory cell selecting MISFET Qt.

Figure 11:
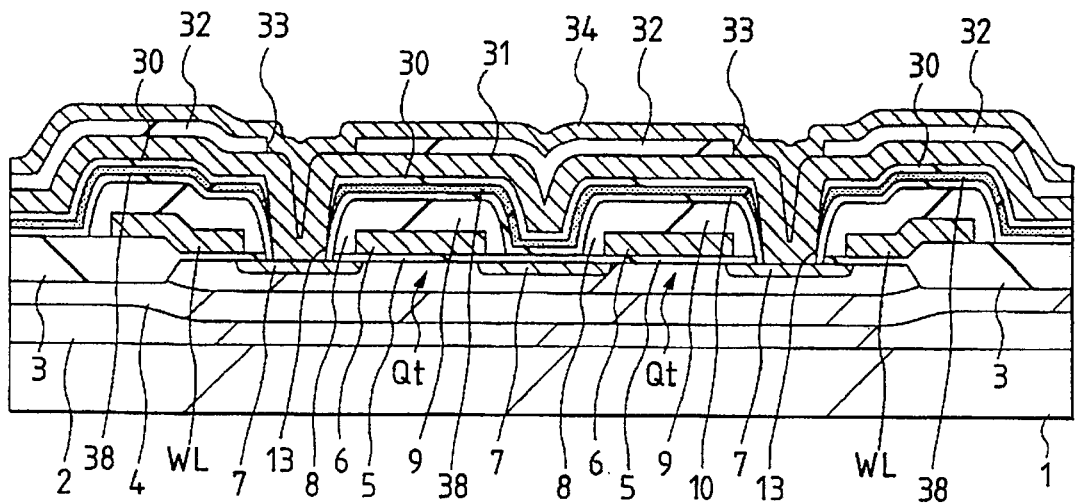
FIG. 11 is a section of an essential portion of the semiconductor substrate and shows a fabrication process of the memory cell of the DRAM according to one embodiment of the present invention.

Next, as shown in FIG. 11, an insulating film 32 (having a thickness of 100 nm) made of silicon oxide is deposited over the whole surface of the semiconductor substrate 1 by the CVD method and is formed in its portion with a connection hole 33 by the dry-etching method using a photoresist as the mask. After this, a third-layered polycrystalline silicon film 34 (having a thickness of 50 to 100 nm) is deposited over the whole surface of the semiconductor substrate 1 by the CVD method. This polycrystalline silicon film 34 forms another part of the storage electrode 11 of the information storing capacity element C and is doped with an n-type impurity (e.g., phosphor) of 2 to 3×10$^{20}$/cm$^3$ until it is connected through the aforementioned connection hole 33 with the second-layered polycrystalline silicon film 31.

Figure 12:
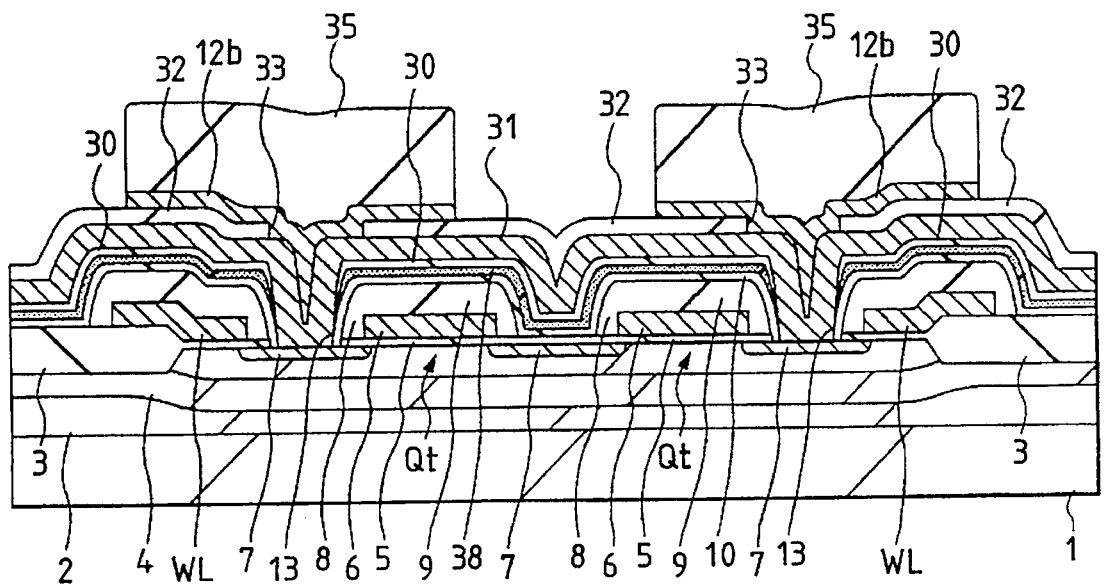
FIG. 12 is a section of an essential portion of the semiconductor substrate and shows a fabrication process of the memory cell of the DRAM according to one embodiment of the present invention.
Figure 13:
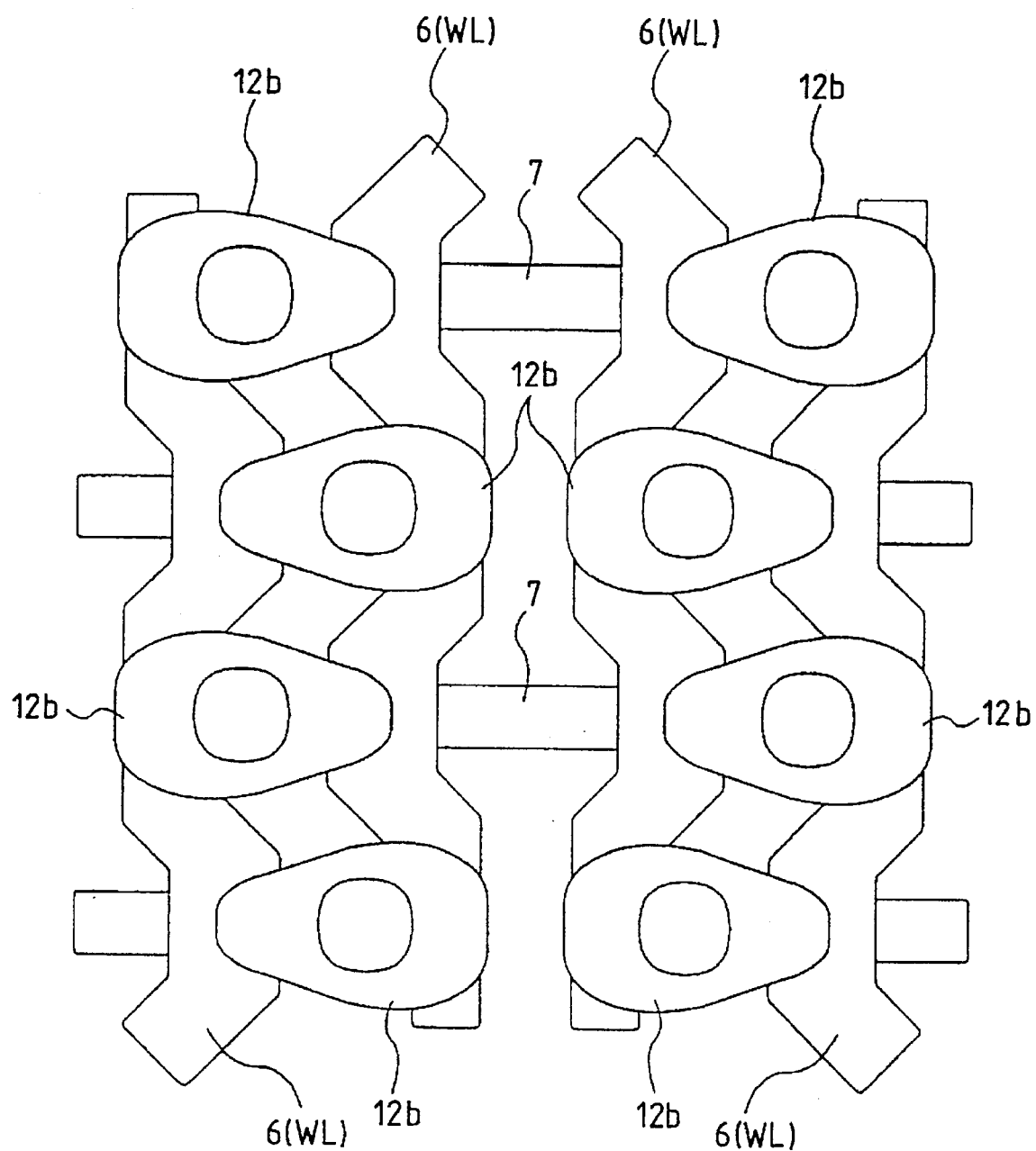
FIG. 13 is a top plan view showing a layout of lower-layer fins of the memory cell of the DRAM according to one embodiment of the present invention.

Next, as shown in FIGS. 12 and 13, the aforementioned third-layered polycrystalline silicon film 34 is patterned to form the upper-layer fin 12b by the dry-etching method using a photoresist 35 (i.e., a first mask having a first pattern) as the mask. If, at this time, the polycrystalline silicon film 31 is patterned with the minimum working size (e.g., 0.5 μm) of the memory cell of the DRAM, the clearance between the fins 12b and 12b, which are adjacent to each other in the extending direction the word lines WL, is substantially equalized to that minimum working size.

Figure 14:
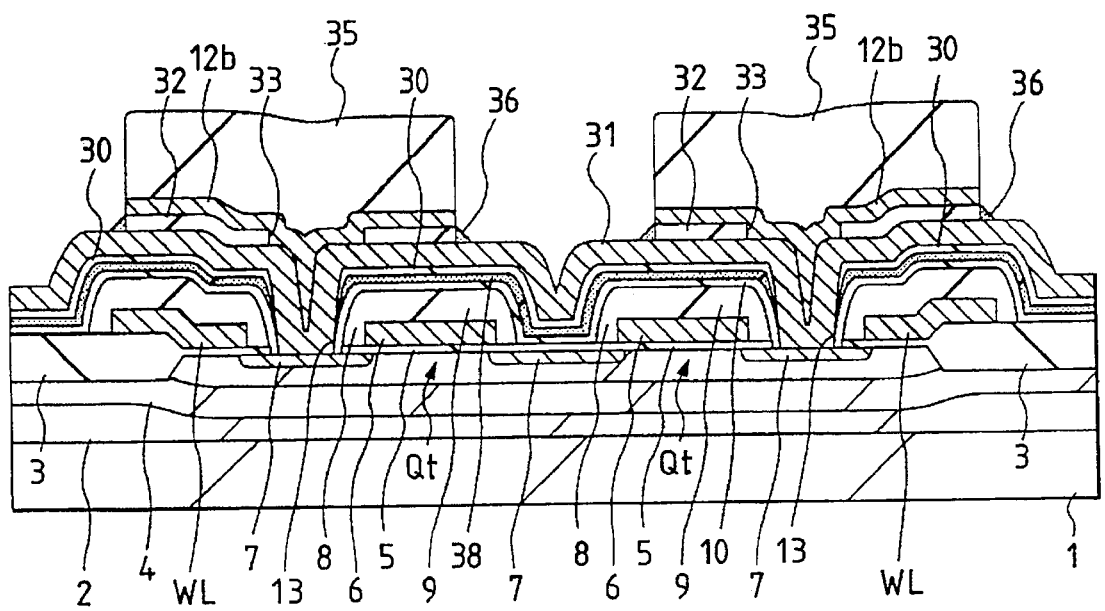
FIG. 14 is a section of an essential portion of the semiconductor substrate and shows a fabrication process of the memory cell of the DRAM according to one embodiment of the present invention.

Next, as shown in FIG. 14, the insulating film 32 below the fin 12b is patterned by the dry-etching method using the aforementioned photoresist 35 as the mask. This dry-etching condition is selected such that a polymer 36 is applied to the whole periphery of the side walls of the patterned insulating film 32. As a result, there is formed the second mask which has its second pattern enlarged in self-alignment from the first pattern of the first mask. Here, the second mask is formed of the first mask 35 and the polymer 36.

In order to apply this polymer 36 to the side walls of the insulating film 32, the dry-etching method is carried out by dropping the temperature of the semiconductor substrate 1 to 0° C. or a lower level (e.g., 0° C. to –50° C.), for example. Moreover, the amount of application of the polymer 36 can also be controlled by optimizing the gas ratio of the process gas used therefor. In case the process gas is exemplified by (CHF$_3$+CF$_4$), the amount of application of the polymer 36 can be augmented by raising the ratio of CHF$_3$ more than that in the ordinary dry-etching method.

In the present embodiment, although not especially limitative, the insulating film 32 was patterned under the following etching conditions to apply the polymer 36 to the side walls of the insulating film 32:

Process Gas:

CHF$_3$+CF$_4$+Ar

Gas Flow Rate:

10 ml/min. for CHF$_3$ 10 ml/min. for CF$_4$ 100 ml/min. for Ar

Stage Temp.:

–30° C.

Process Pr.:

250 mTorr

RF Power:

60 W

At this time, the width (or horizontal thickness) of the applied polymer 36 had a maximum of about 0.1 μm and a minimum of about 0.05 μm (and an average of 0.08 μm).

Figure 15:
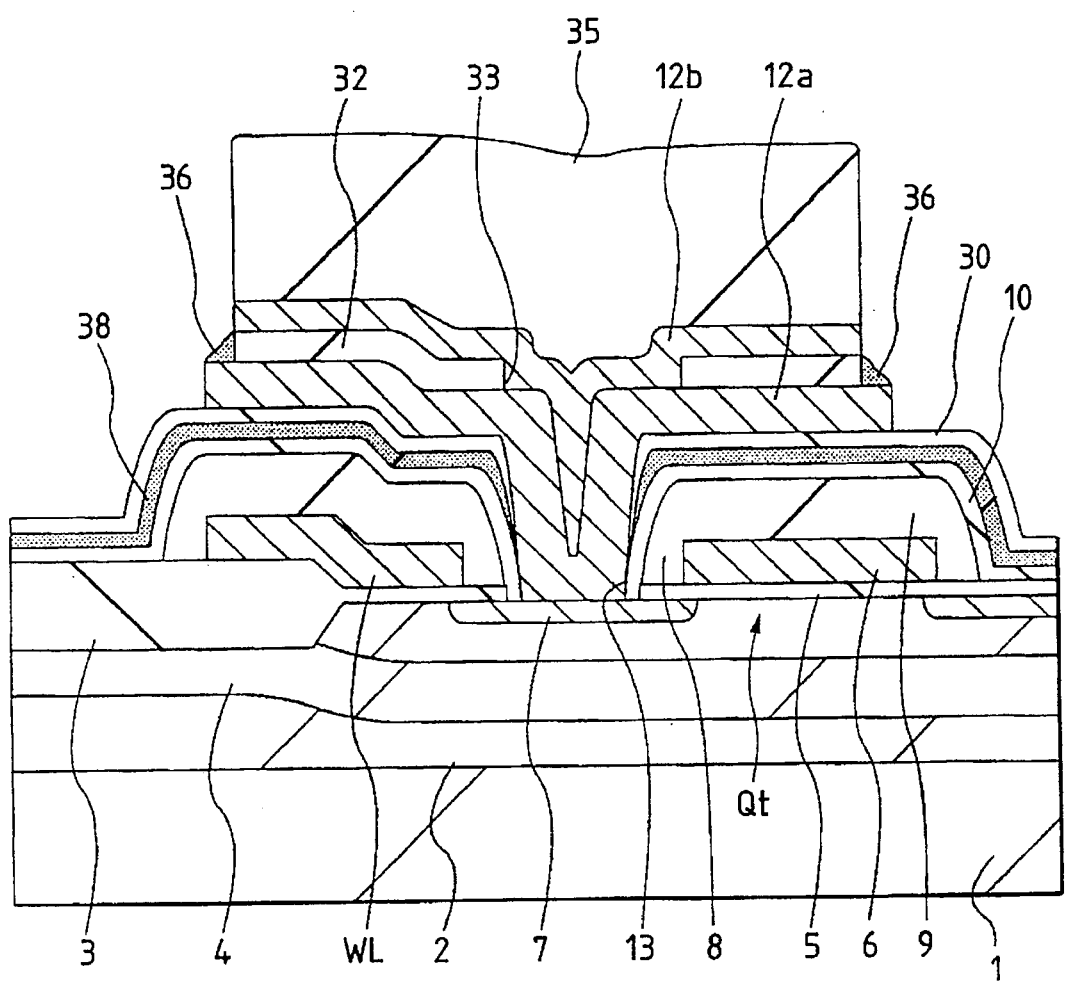
FIG. 15 is an enlarged section of an essential portion of the semiconductor substrate and shows a fabrication process of the memory cell of the DRAM according to one embodiment of the present invention.
Figure 16:
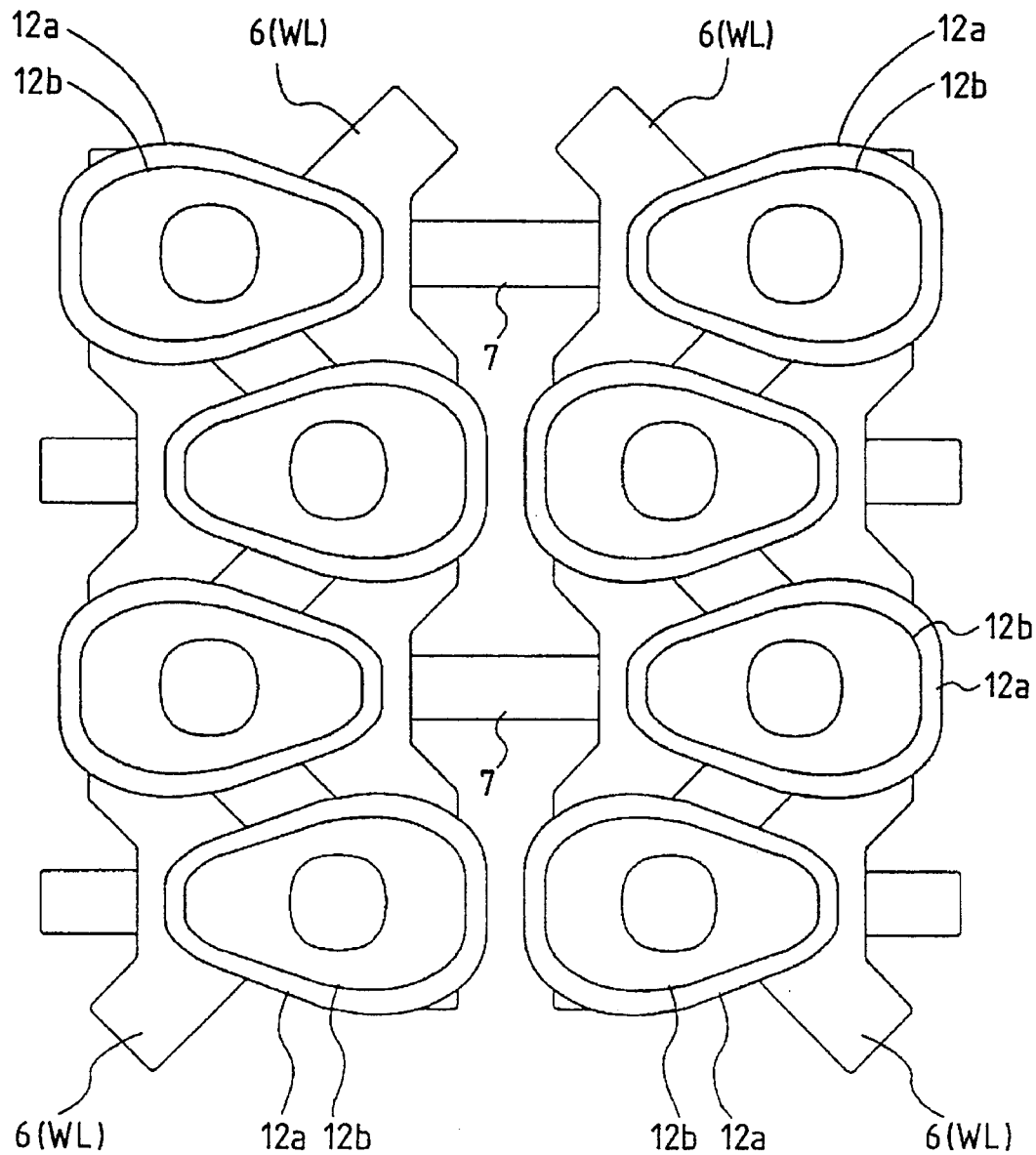
FIG. 16 is a top plan view showing a layout of lower-layer fins and upper-layer fins of the memory cell of the DRAM according to one embodiment of the present invention.

Next, as shown in FIGS. 15 and 16, the polycrystalline silicon film 31 below the aforementioned insulating film 32 is patterned to form the lower-layer film 12a by the dry-etching method using the aforementioned photoresist 35 and polymer 36 as the mask.

Since the lower-layer fin 12a is formed by the etching method using the photoresist 35 and the polymer 36 as the mask, it is given a larger horizontal size than that of the upper-layer fin 12b which is formed by using only the photoresist 35 as the mask. Since the polymer 36 is applied to the whole periphery of the side walls of the insulating film 32, more specifically, the horizontal size of the lower-layer fin 12a is about two times as large as the width of the polymer 36. Since, moreover, the clearance between the upper-layer fins 12b of the adjoining memory cells is substantially equal to the minimum working size of the DRAM, the clearance between the lower-layer fins 12a and 12a of the adjoining memory cells is far smaller than that minimum working size.

In the present embodiment, moreover, the polycrystalline silicon films (31 and 34) are patterned to form the fins 12a and 12b by the dry-etching method, so that the fins 12a and 12b can be formed with a higher size accuracy than that of the case in which the polycrystalline silicon films are patterned by the wet-etching method.

Figure 17:
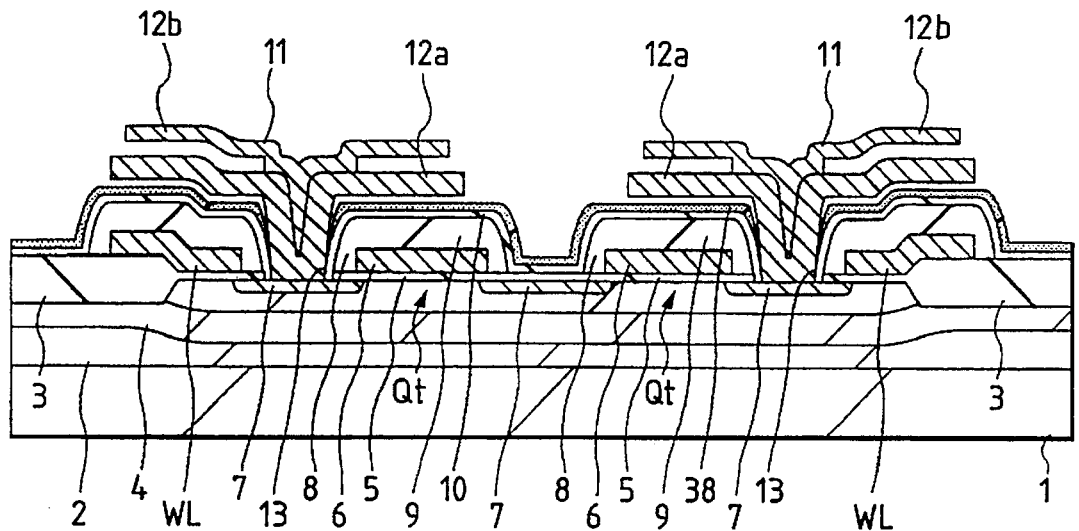
FIG. 17 is a section of an essential portion of the semiconductor substrate and shows a fabrication process of the memory cell of the DRAM according to one embodiment of the present invention.

Next, the aforementioned photoresist 35 is ashed off. After this, both the insulating film 32 left between the upper-layer fin 12b and the lower-layer fin 12a and the insulating film 30 below the lower-layer fin 12a are simultaneously removed by the wet-etching method using an etching liquid of hydrofluoric acid, to form the storage electrode 11 having a two-layered fin structure, as shown in FIG. 17.

Since, in the present embodiment, there is formed below the aforementioned insulating film 30 the insulating film 38 of silicon nitride, which is hard to etch by the etching liquid of hydrofluoric acid, it is possible to reliably prevent a disadvantage that the insulating film 10 of silicon oxide or the like might otherwise be etched by that etching liquid to scrape the surface of the semiconductor substrate 1.

Figure 18:
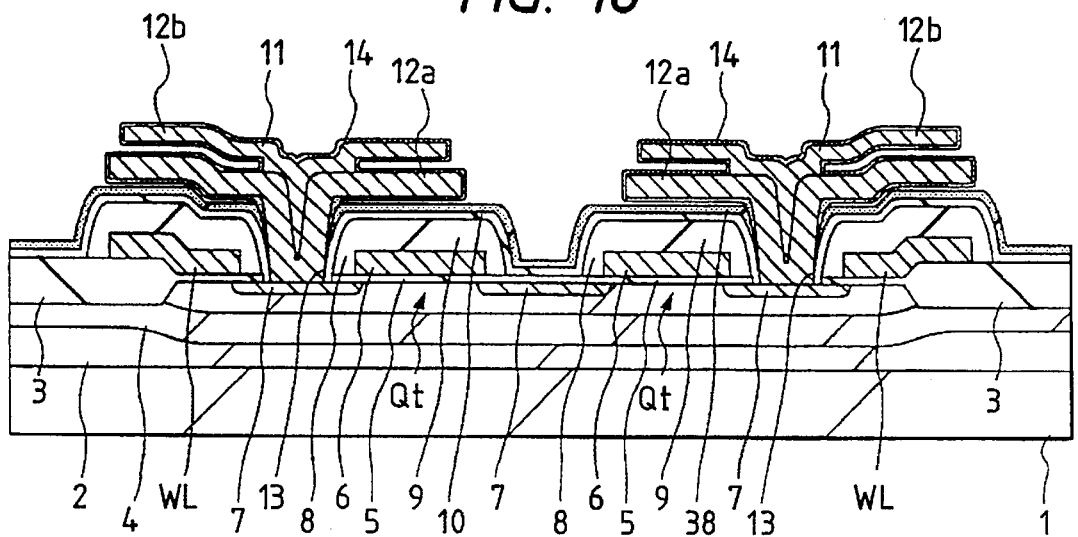
FIG. 18 is a section of an essential portion of the semiconductor substrate and shows a fabrication process of the memory cell of the DRAM according to one embodiment of the present invention.
Figure 19:
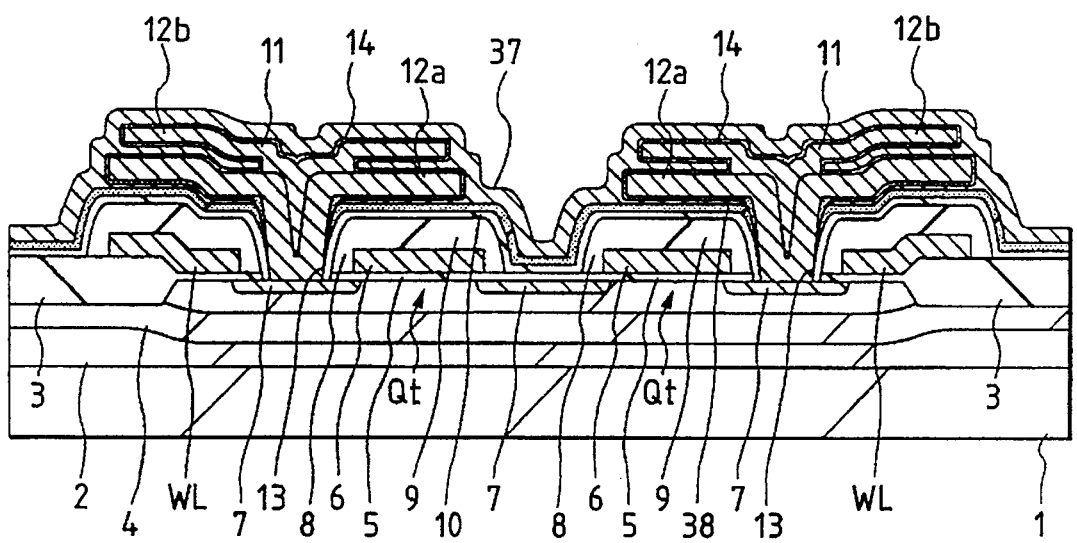
FIG. 19 is a section of an essential portion of the semiconductor substrate and shows a fabrication process of the memory cell of the DRAM according to one embodiment of the present invention.

Next, as shown in FIG. 18, a silicon nitride film of about 10 nm or less is deposited on the surface of the storage electrode 11 by the CVD method to form the dielectric film 14. After this, as shown in FIG. 19, a fourth-layered polycrystalline silicon film 37 (having a thickness of 50 to 100 nm) is deposited over the whole surface of the semiconductor substrate 1 by the CVD method. The dosage of an n-type impurity (e.g., phosphor) for doping that polycrystalline silicon film 37 is $5 \times 10^{20}/cm^3$.

Figure 20:
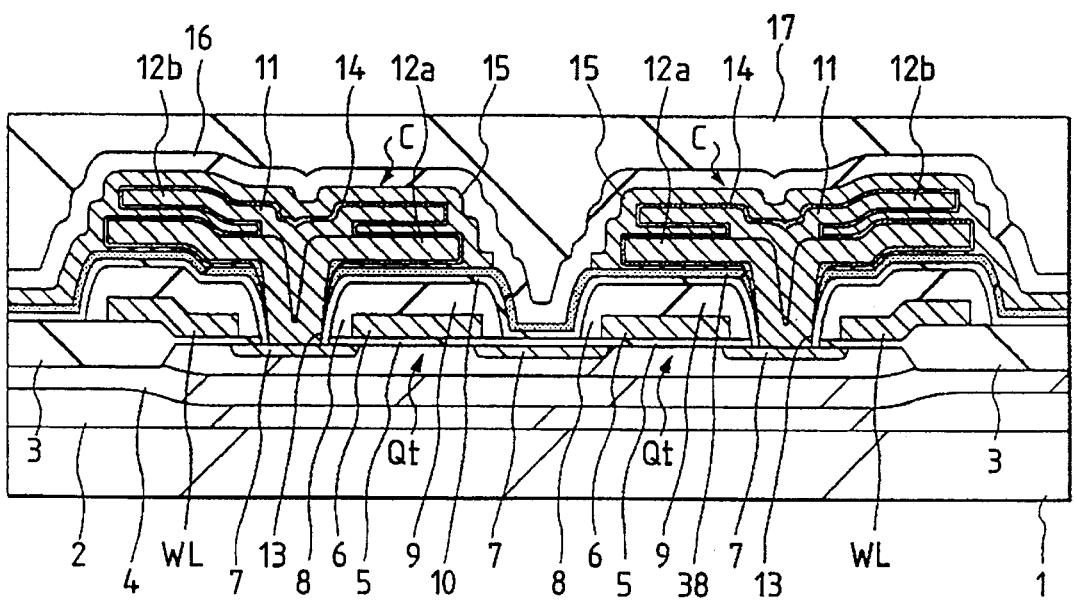
FIG. 20 is a section of an essential portion of the semiconductor substrate and shows a fabrication process of the memory cell of the DRAM according to one embodiment of the present invention.

Next, as shown in FIG. 20, the aforementioned polycrystalline silicon film 37 is patterned to form the plate electrode 15 of the information storing capacity element C by the dry-etching method using a photoresist as the mask. After this there are sequentially deposited over the whole surface of the semiconductor substrate 1 by the CVD method the insulating film 16 (of a silicon oxide film having a thickness of 100 to 200 nm) and the inter-layer insulating film 17 (of a BPSG film having a thickness of 500 to 600 nm), of which the inter-layer insulating film 17 is thermally treated at 900° to 950° C. to have its surface flattened.

Figure 21:
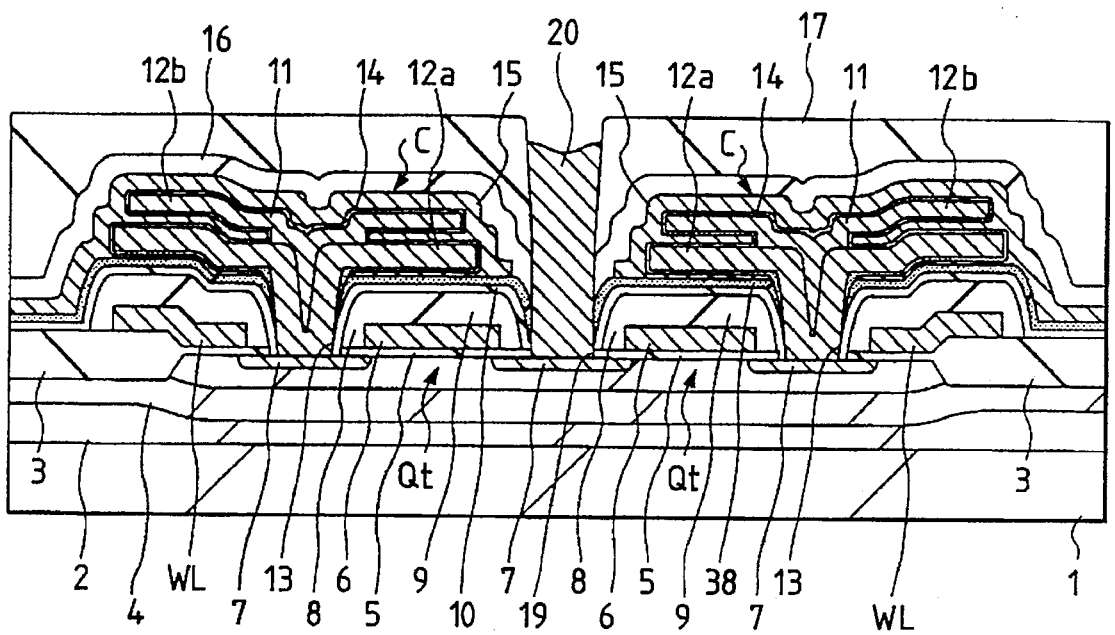
FIG. 21 is a section of an essential portion of the semiconductor substrate and shows a fabrication process of the memory cell of the DRAM according to one embodiment of the present invention.

Next, as shown in FIG. 21, the inter-layer insulating film 17, the insulating film 16, the insulating film 38 and an insulating film (i.e., an insulating film formed at the same step as that of the gate insulating film 5) are dry-etched by using a photoresist as the mask, to form the connection hole 19 leading to one semiconductor region 7 of the memory cell selecting MISFET Qt. Subsequently, the fifth-layered polycrystalline silicon film 20 (having a thickness of 400 to 500 nm) is deposited by the CVD method over the whole surface of the semiconductor substrate 1 including the inside of the connection hole 19. After this, the polycrystalline silicon film 20 is etched back to remove the polycrystalline silicon film 20 from over the inter-layer insulating film 17 but is left in the connection hole 19. An n-type impurity (e.g., phosphor) for doping that polycrystalline silicon film 20 has a dosage of 2 to 3 $10^{20}/cm^3$.

Figure 22:
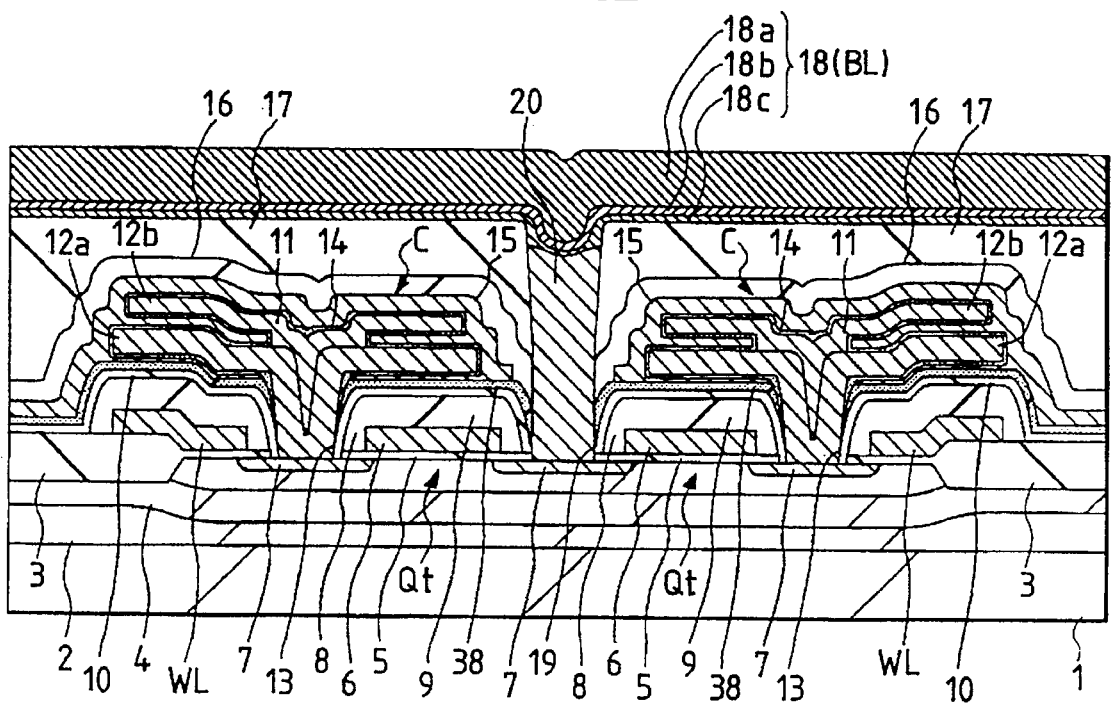
FIG. 22 is a section of an essential portion of the semiconductor substrate and shows a fabrication process of the memory cell of the DRAM according to one embodiment of the present invention.
Figure 23:
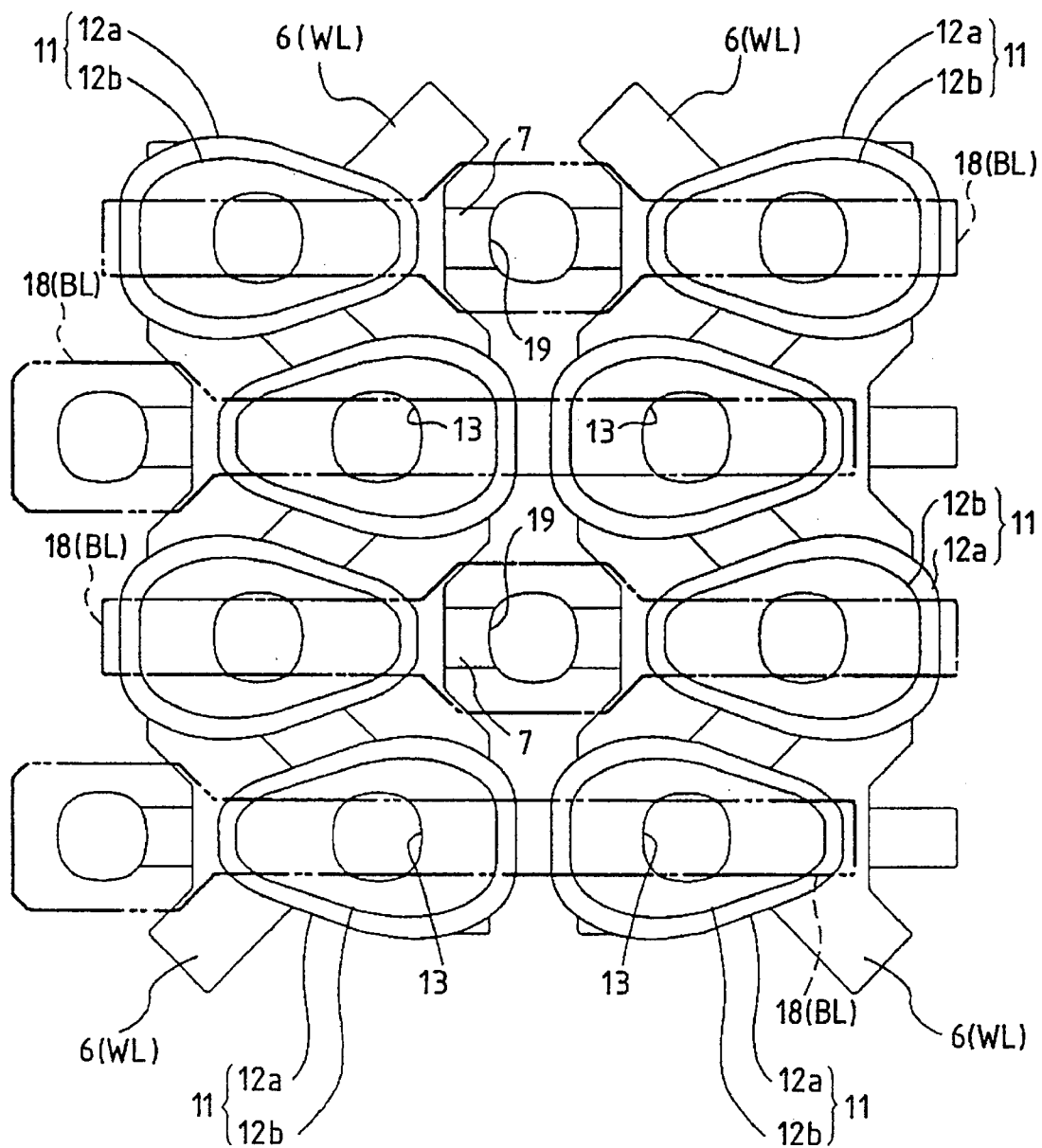
FIG. 23 is a top plan view showing a layout of bit lines of the memory cell of the DRAM according to one embodiment of the present invention.

Next, as shown in FIGS. 22 and 23, a Ti film (having a thickness of 10 to 20 nm) and a TiN film (having a thickness of 100 to 150 nm) are deposited over the whole surface of the semiconductor substrate 1 by the sputtering method, and a W film (having a thickness of 200 to 300 nm) is then deposited over the TiN film by the CVD method. After this, those films are patterned to form the first wiring layer 18 (i.e., the bit lines BL) over the inter-layer insulating film 17 by the dry-etching method using a photoresist as the mask. Incidentally, the plate electrode 15 is omitted from FIG. 23.

Figure 24:
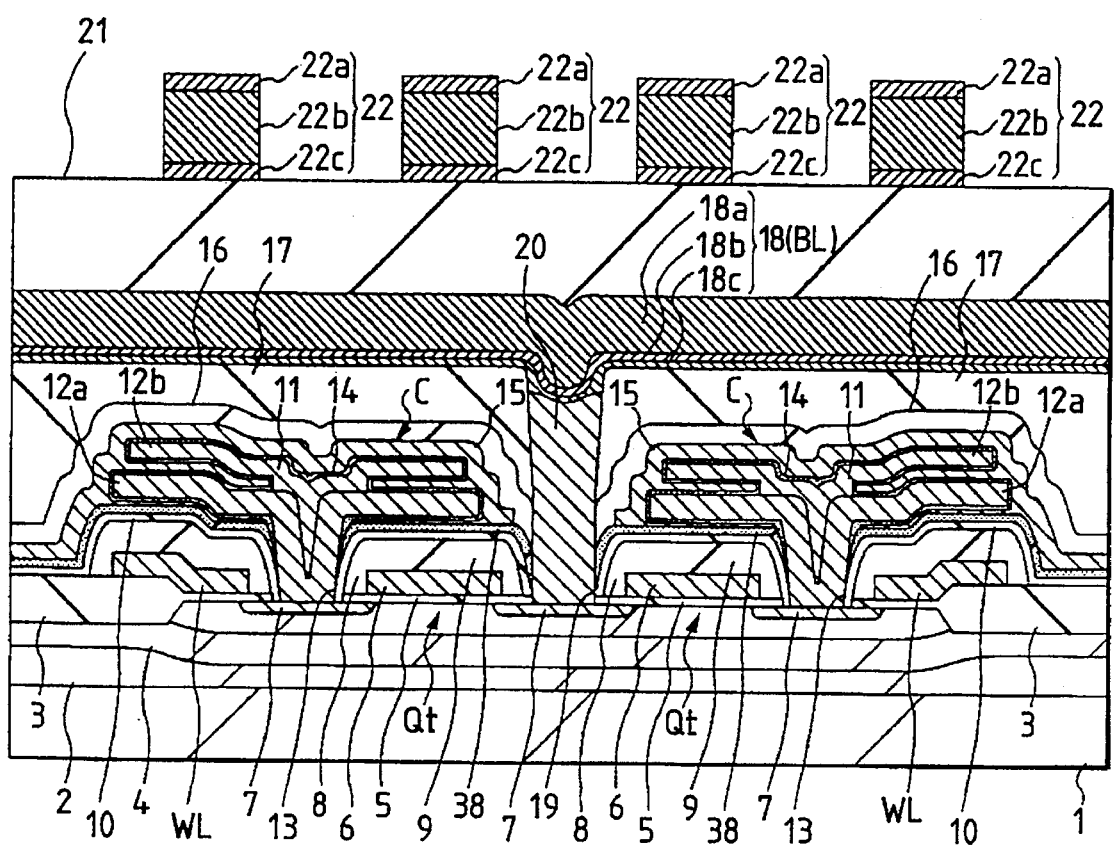
FIG. 24 is a section of an essential portion of the semiconductor substrate and shows a fabrication process of the memory cell of the DRAM according to one embodiment of the present invention.

Next, as shown in FIG. 24, a silicon oxide film (having a thickness of 400 to 500 nm), a spin-on glass film and a silicon oxide film (having a thickness of 400 to 500 nm) are sequentially deposited over the whole surface of the semiconductor substrate 1, to form the inter-layer insulating film 21 formed of those laminated films. Of these the silicon oxide film is deposited by the CVD method, and the spin-on glass film is deposited by the spin-coating method. Subsequently, there are sequentially deposited over the whole surface of the semiconductor substrate 1 by the sputtering method a Ti film (having a thickness of 10 to 20 nm), an Al film (having a thickness of 400 to 500 nm) and a TiN film (having a thickness of 50 to 100 nm), which are then patterned to form the second wiring layer 22 over the inter-layer insulating film 21 by the dry-etching method using a photoresist as the mask. The second wiring layer 22 forms the main word lines which are connected with the word lines WL.

Figure 25:
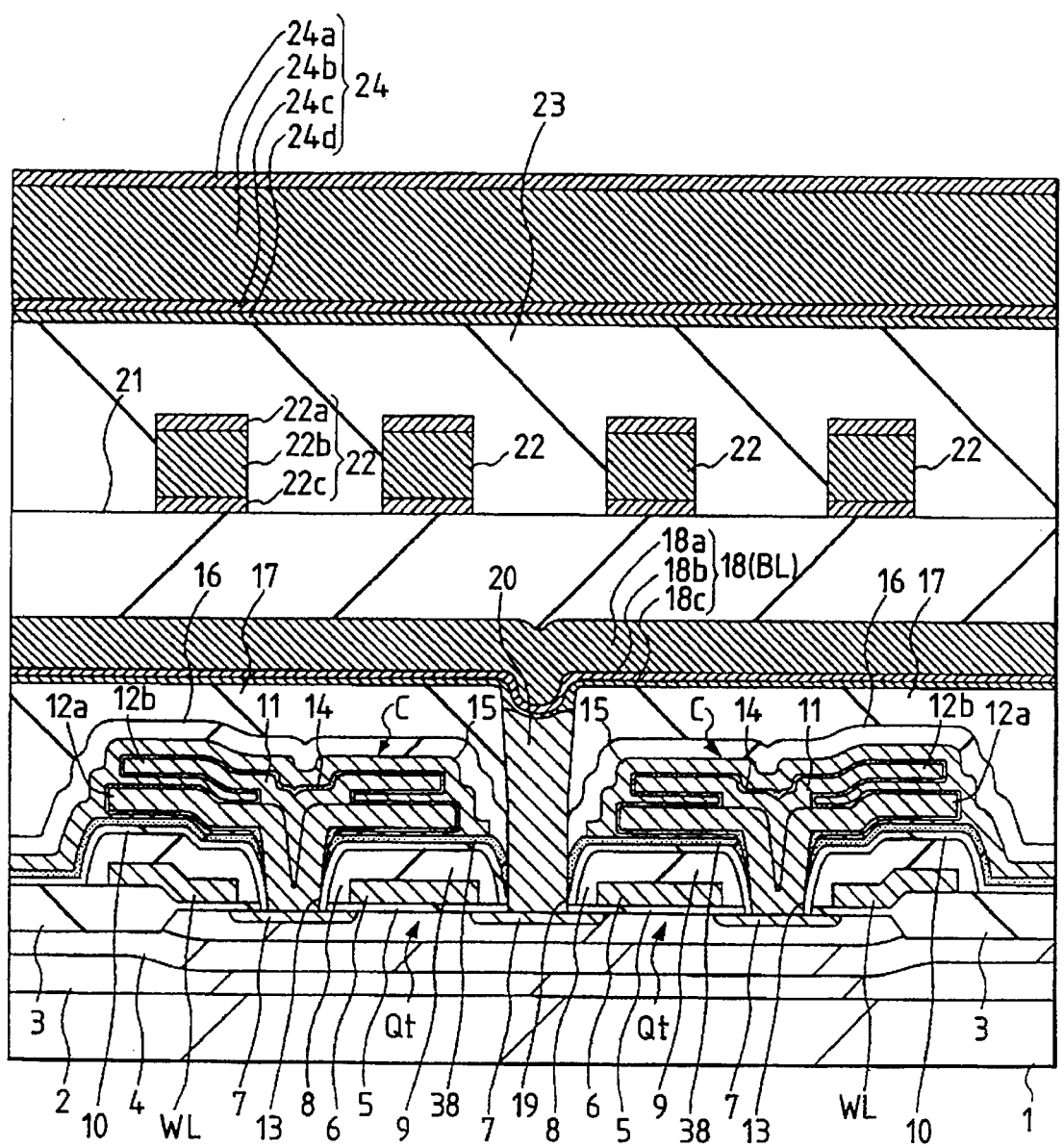
FIG. 25 is a section of an essential portion of the semiconductor substrate and shows a fabrication process of the memory cell of the DRAM according to one embodiment of the present invention.

Next, as shown in FIG. 25, there are sequentially deposited over the whole surface of the semiconductor substrate 1 a silicon oxide film (having a thickness of 500 to 600 nm), a spin-on glass film and a silicon oxide film (having a thickness of 500 to 600 nm), to form the inter-layer insulating film 23 of those laminated films. Subsequently, there are sequentially deposited over the whole surface of the semiconductor substrate 1 by the sputtering method a Ti film (having a thickness of 10 to 20 nm), a TiN film (having a thickness of 100 to 150 nm), an Al film (having a thickness of 600 to 800 nm) and a TiN film (having a thickness of 50 to 100 nm), which are then patterned to form the third wiring layer 24 over the inter-layer insulating film 12 by the dry-etching method using a photoresist as the mask. This third wiring layer 24 forms the column select lines each for the four bit lines BL.

After this, there are sequentially deposited over the uppermost layer of the semiconductor substrate 1 by the CVD method a silicon oxide film and a silicon nitride film, which are laminated to form the passivation film 25, thus completing the memory cell of the DRAM of the present embodiment shown in FIG. 1.

Thus, in the memory cell of the DRAM of the present embodiment, the storage electrode 11 has its lower-layer fin 12a given a larger horizontal size than that of the upper-layer fin 12b so that the clearance between that fin 12a and the lower-layer fin 12a of the adjoining storage electrode 11 is made smaller than the maximum working size of the memory cell of the DRAM. As a result, the storage electrode 11 can have its surface area increased according to the increase in the horizontal size of the lower-layer fin 12a thereby to augment the quantity (Cs) of stored electric charge of the information storing capacity element C.

In the memory cell of the DRAM of the present embodiment, moreover, the storage electrode 11 has its fins 12a and 12b formed by the dry-etching method so that the sizing accuracy of the fins 12a and 12b can be improved.

[Embodiment 2]

With reference to FIGS. 26 to 31, here will be described another method of fabricating the storage electrode 11 of the foregoing Embodiment 1.

Figure 26:
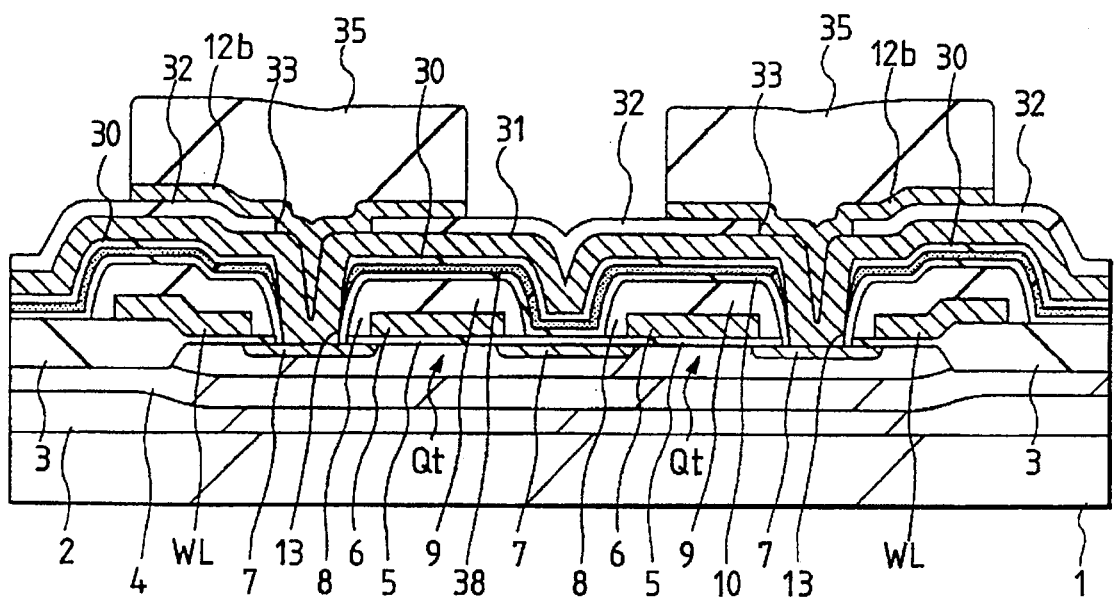
FIG. 26 is a section of an essential portion of the semiconductor substrate and shows a fabrication process of the memory cell of the DRAM according to another embodiment of the present invention.

First of all, as shown in FIG. 26, the third-layered polycrystalline silicon film (34) is patterned to form the upper-layer fin 12b of the storage electrode 11 by the dry-etching method using the photoresist 35 as the mask. The steps to this are identical to those of the fabrication method of the foregoing Embodiment 1, and the clearance between the fins 12b and 12b of the adjoining memory cells is substantially equalized to the minimum working size of the memory cell of this DRAM.

Figure 27:
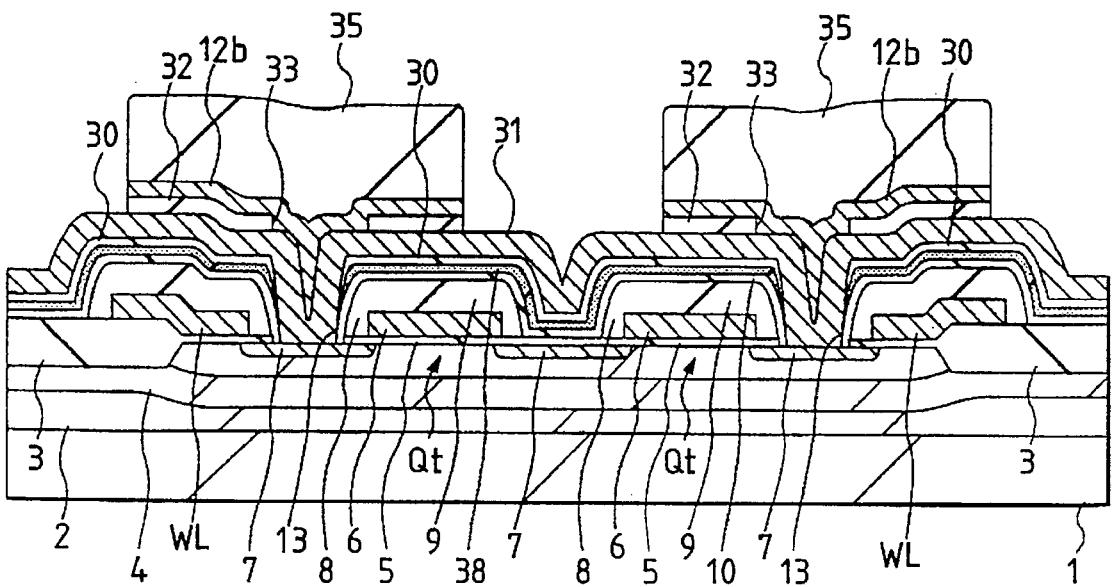
FIG. 27 is a section of an essential portion of the semiconductor substrate and shows a fabrication process of the memory cell of the DRAM according to another embodiment of the present invention.

Next, as shown in FIG. 27, the insulating film 32 below the fin 12b is patterned by the dry-etching method using the aforementioned photoresist (or the first mask having the first pattern) as the mask. This dry-etching method is carried out under the ordinary etching condition in which no polymer is applied to the side walls of the patterned insulating film 32.

Figure 28:
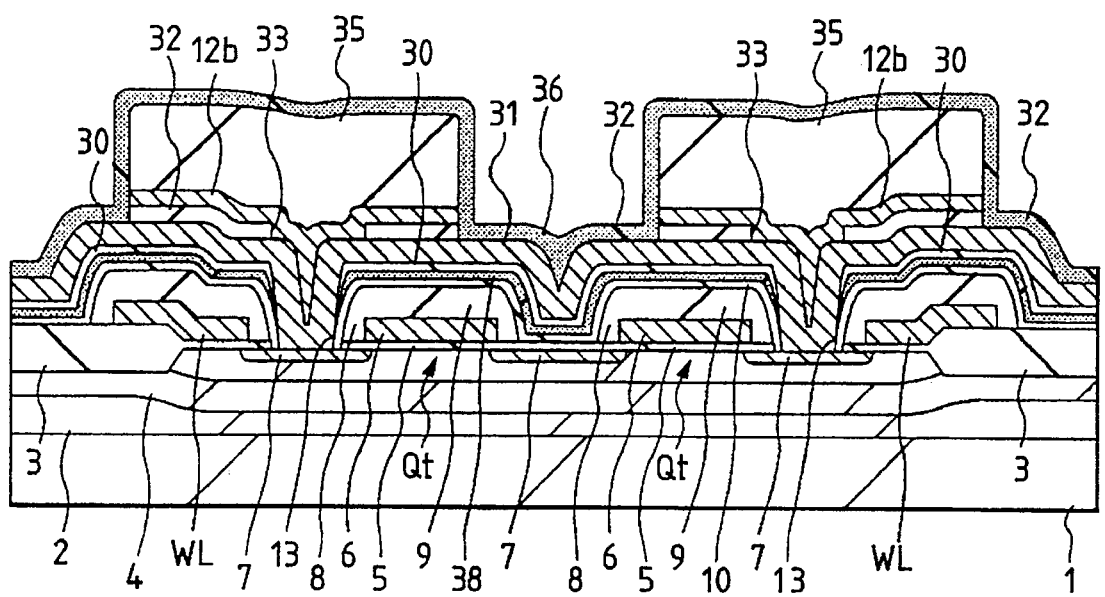
FIG. 28 is a section of an essential portion of the semiconductor substrate and shows a fabrication process of the memory cell of the DRAM according to another embodiment of the present invention.

Next, as shown in FIG. 28, the polymer 36 is deposited to have a thickness of about 100 to 200 nm over the whole surface of the semiconductor substrate 1 including the surface of the aforementioned photoresist 35. This polymer 36 is deposited at such a temperature that the photoresist 35 may not be deteriorated. Incidentally, the polymer 36 may be replaced by an insulating film such as a silicon nitride film or a silicon oxide film, and this insulating film is deposited at a low temperature. As a result, there is formed the second mask which has its second pattern enlarged in self-alignment from the first pattern of the first mask. Here, the second mask is formed of the first mask 35 and the polymer 36. This relation between the first mask and the second mask is similarly retained in the following embodiments.

The present embodiment used the ECR (i.e., Electron Cyclotron Resonance) type dry-etching apparatus and deposits the polymer 36 under the following etching conditions, although not especially limited thereto:

Process Gas:

$C_2F_6$ (Gas Flow Rate: 10 ml/min.)

Stage Temp.:

−40° C.

Process Pr.:

5 mTorr

RF Power:

60 W

Microwaves:

300 mA.

Figure 29:
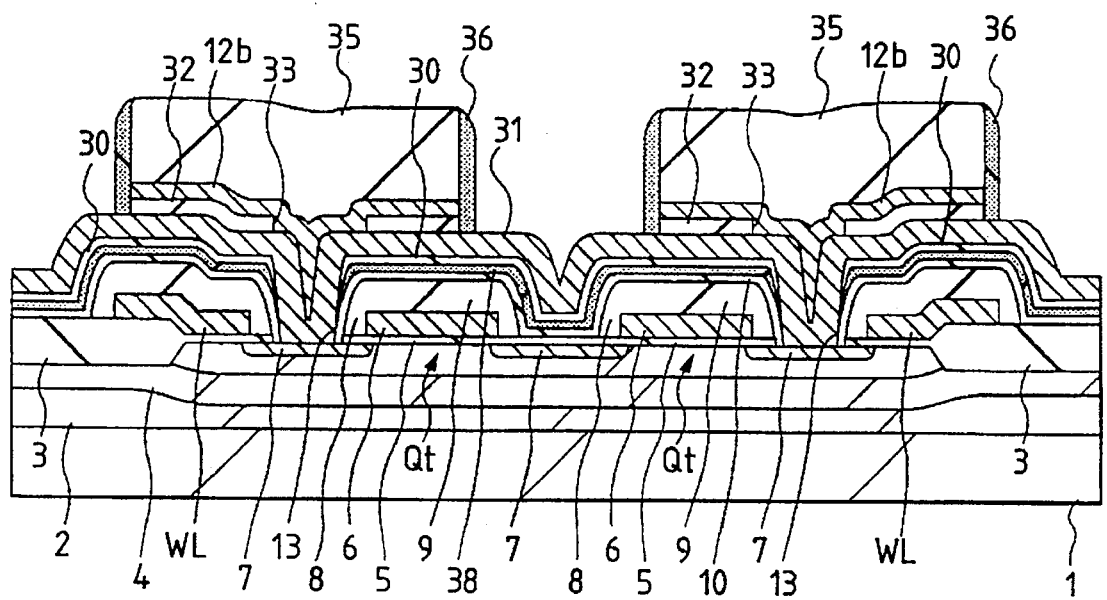
FIG. 29 is a section of an essential portion of the semiconductor substrate and shows a fabrication process of the memory cell of the DRAM according to another embodiment of the present invention.
Figure 30:
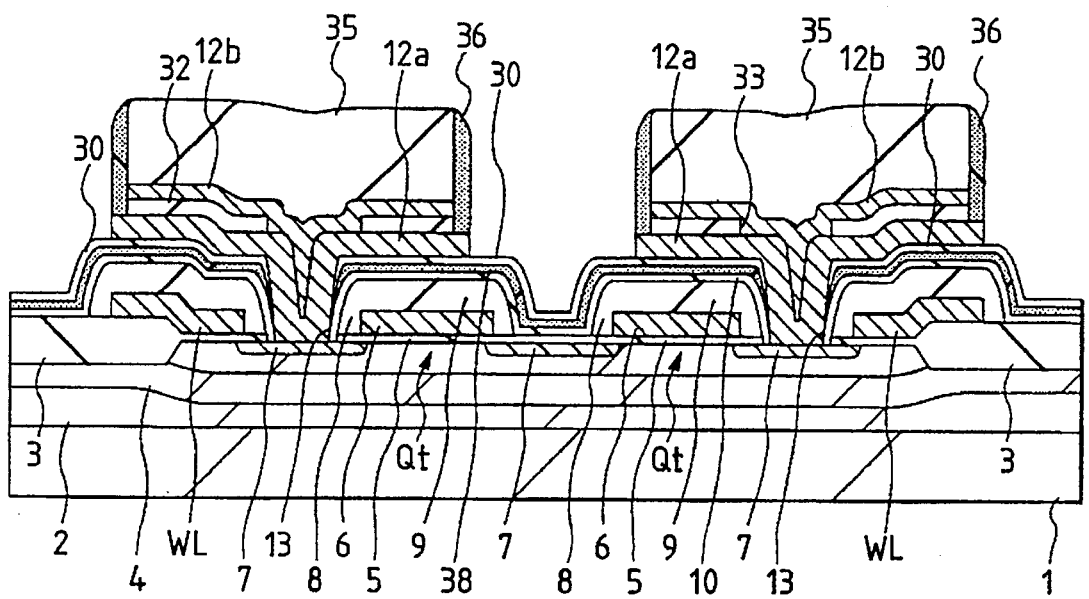
FIG. 30 is a section of an essential portion of the semiconductor substrate and shows a fabrication process of the memory cell of the DRAM according to another embodiment of the present invention.

Next, as shown in FIG. 29, the aforementioned polymer is etched back to leave the polymer 36 on the individual side walls of the photoresist 35, the fin 12b and the insulating film 32. Subsequently, as shown in FIG. 30, the polycrystalline silicon film 31 below the insulating film 32 is patterned to form the lower-layer fin 12a by the dry-etching method using the photoresist 35 and the polymer 36 as the mask.

Since the aforementioned lower-layer fin 12a is formed by the etching method using the photoresist 35 and the polymer 36 as the mask, it is given a wider horizontal size, as in the foregoing Embodiment 1, than that of the upper-layer fin 12b which is formed by using only the photoresist 35 as the mask. Since, moreover, the clearance between the upper-layer fins 12b of the adjoining memory cells is substantially equal to the minimum working size of the DRAM, the clearance between the lower-layer fins 12a and 12a of the adjoining memory cells is made smaller than that minimum working size.

Figure 31:
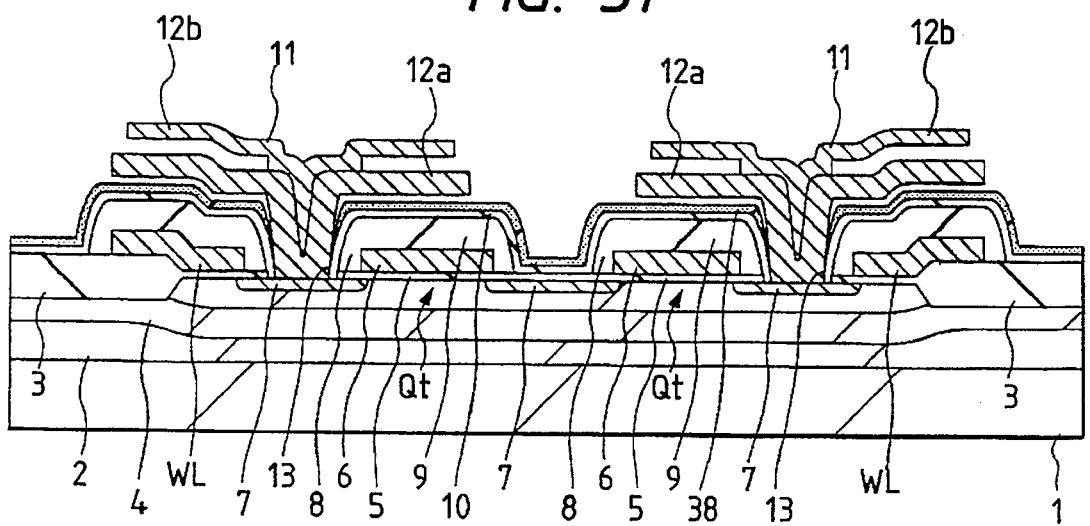
FIG. 31 is a section of an essential portion of the semiconductor substrate and shows a fabrication process of the memory cell of the DRAM according to another embodiment of the present invention.

Next, the aforementioned photoresist 35 and polymer 36 are ashed off. After this, both the insulating film 32 left between the upper-layer fin 12b and the lower-layer fin 12a and the insulating film 30 below the lower-layer fin 12a are removed by the wet-etching method using the etching liquid of hydrofluoric acid, to form the storage electrode 11 having the two-layered fin structure, as shown in FIG. 31.

[Embodiment 3]

With reference to FIGS. 32 to 37, here will be described the method of fabricating the memory cells of the DRAM according to another embodiment of the present invention.

Figure 32:
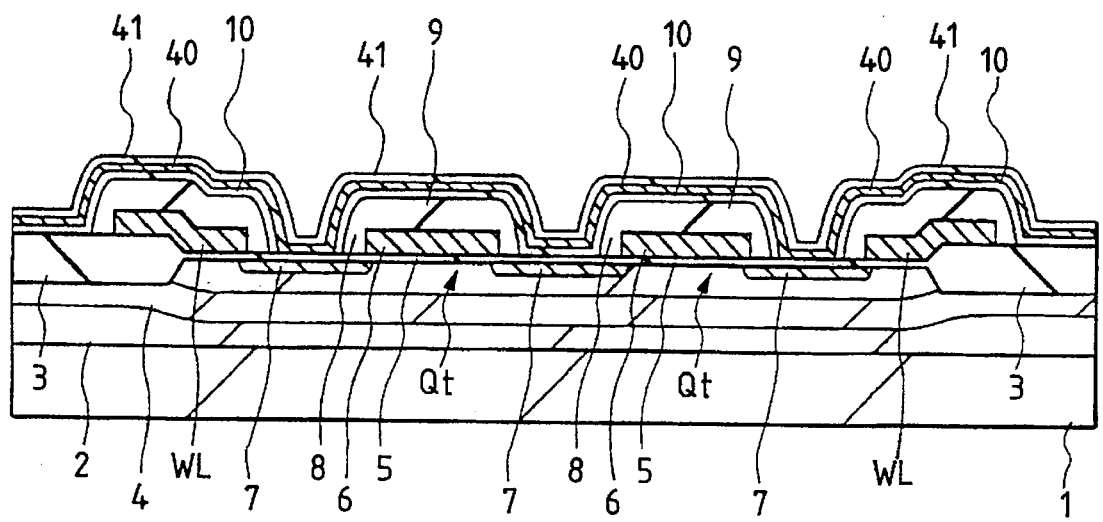
FIG. 32 is a section of an essential portion of the semiconductor substrate and shows a fabrication process of the memory cell of the DRAM according to another embodiment of the present invention.

First of all, as shown in FIG. 32, the memory cell selecting MISFET Qt is formed by a process similar to those of the foregoing Embodiments 1 and 2. After this, there are sequentially deposited over the MISFET Qt by the CVD method the insulating film 10 of silicon oxide, a polycrystalline silicon film 40, and an insulating film 41 of silicon oxide.

Figure 33:
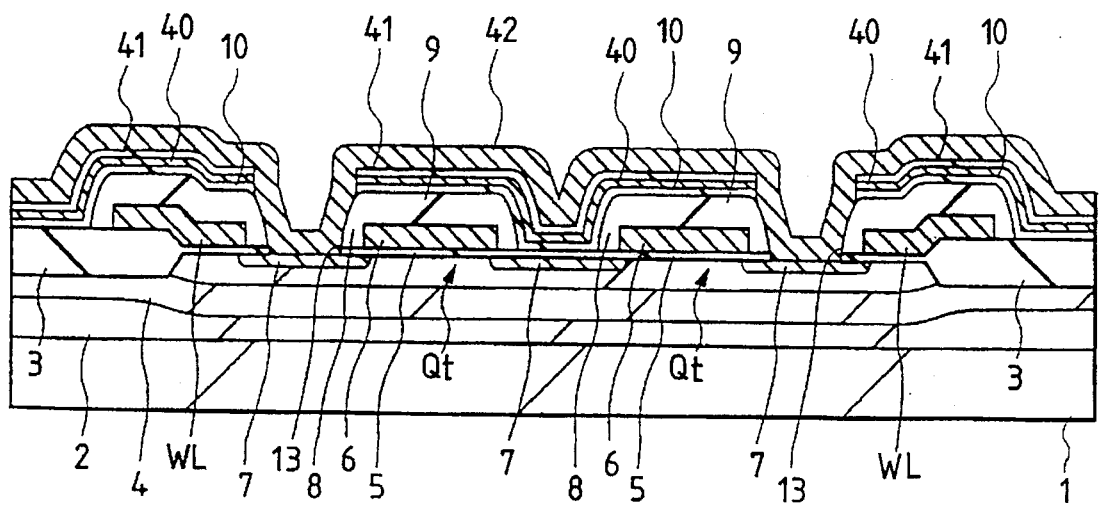
FIG. 33 is a section of an essential portion of the semiconductor substrate and shows a fabrication process of the memory cell of the DRAM according to another embodiment of the present invention.

Next, as shown in FIG. 33, the aforementioned insulating film 41, polycrystalline silicon film 40 and insulating film 10, and the insulating film (i.e., the insulating film formed at the same step as that of the gate insulating film 5) are dry-etched by using the photoresist as the mask, to form the connection hole 13 having a diameter of about 0.6 µm and extending to one semiconductor region 7 of the memory cell selecting MISFET Qt. A process gas of fluorocarbons is used for etching the insulating films 41 and 10, and a process gas of chlorine is used for etching the polycrystalline silicon film 40. Subsequently, a polycrystalline silicon film 42 is deposited by the CVD method over the whole surface of the semiconductor substrate 1. This polycrystalline silicon film 42 is connected through the connection hole 13 with one semiconductor region 7 of the memory cell selecting MISFET Qt.

Figure 34:
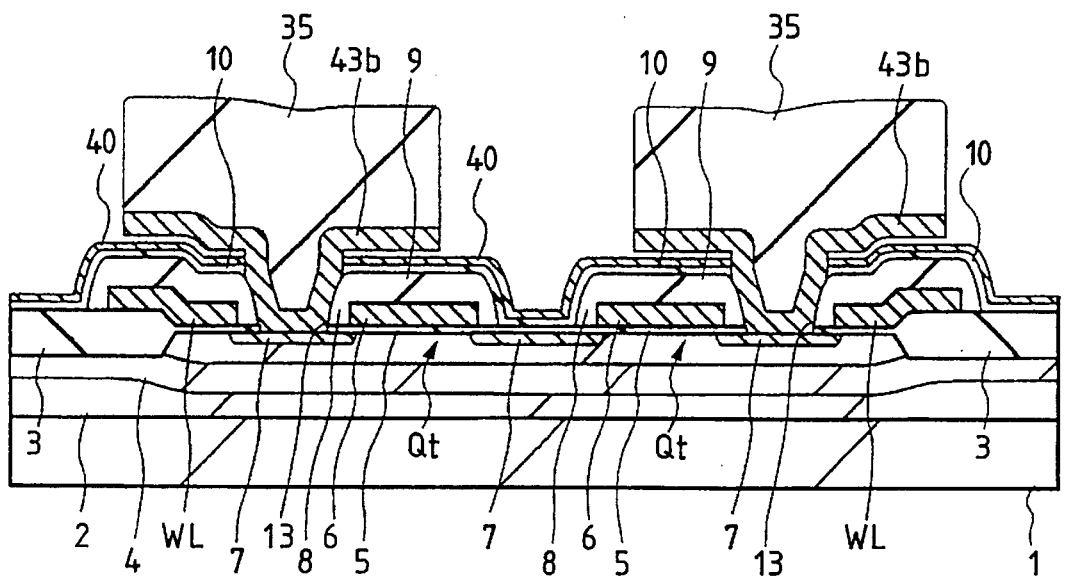
FIG. 34 is a section of an essential portion of the semiconductor substrate and shows a fabrication process of the memory cell of the DRAM according to another embodiment of the present invention.

Next, as shown in FIG. 34, the aforementioned polycrystalline silicon film 42 is patterned to form an upper-layer fin 43b by the dry-etching method using the photoresist 35 as the mask. At this time, the polycrystalline silicon film 42 is patterned with the minimum working size of the memory cells of the DRAM so that the clearance between the fins 43b and 43b of the adjoining memory cells is equalized to that minimum working size. Subsequently, the insulating film 41 below the fin 43b is removed, while leaving the photoresist 35, by the wet-etching method using the etching liquid of hydrofluoric acid.

Figure 35:
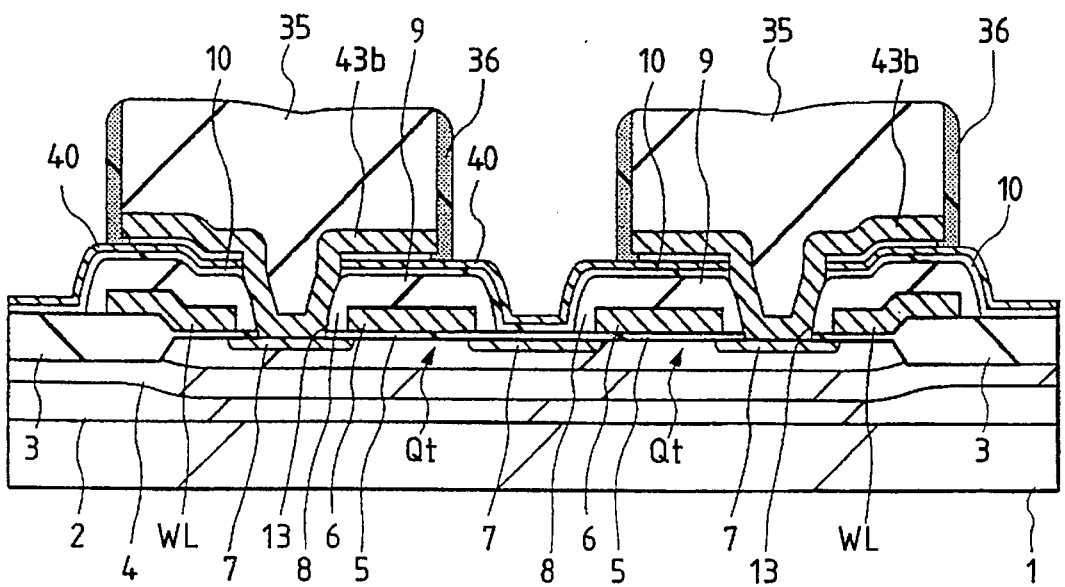
FIG. 35 is a section of an essential portion of the semiconductor substrate and shows a fabrication process of the memory cell of the DRAM according to another embodiment of the present invention.

Next, as shown in FIG. 35, the polymer 36 is deposited by a method similar to that of the foregoing Embodiment 2 over the whole surface of the semiconductor substrate 1 including the surface of the aforementioned photoresist 35. After this, the polymer 36 is etched back while being left on the individual side walls of the photoresist 35 and the fin 43b.

Figure 36:
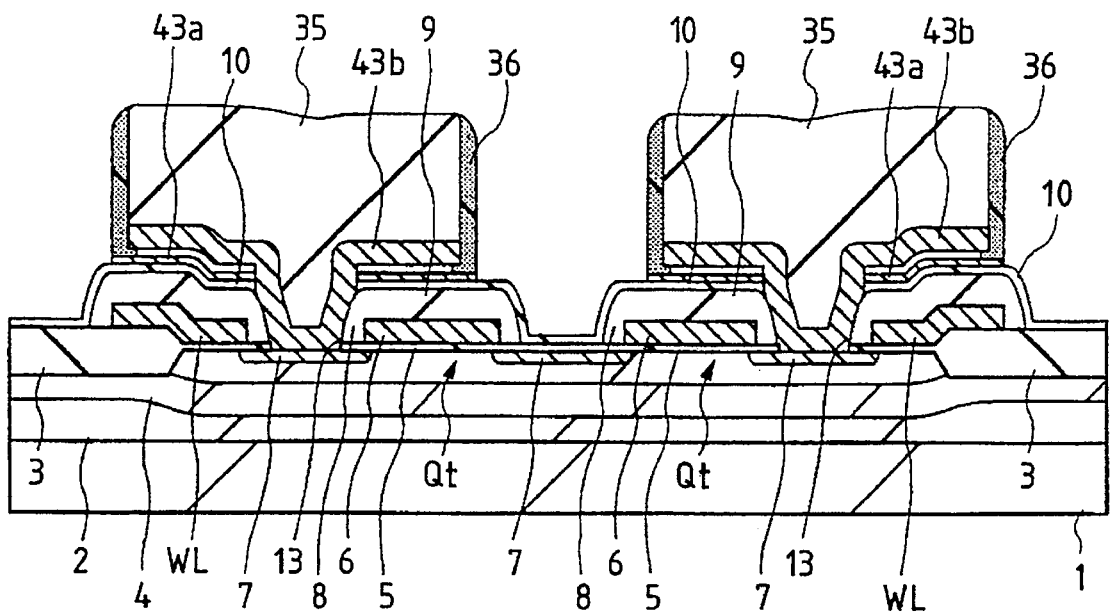
FIG. 36 is a section of an essential portion of the semiconductor substrate and shows a fabrication process of the memory cell of the DRAM according to another embodiment of the present invention.
Figure 37:
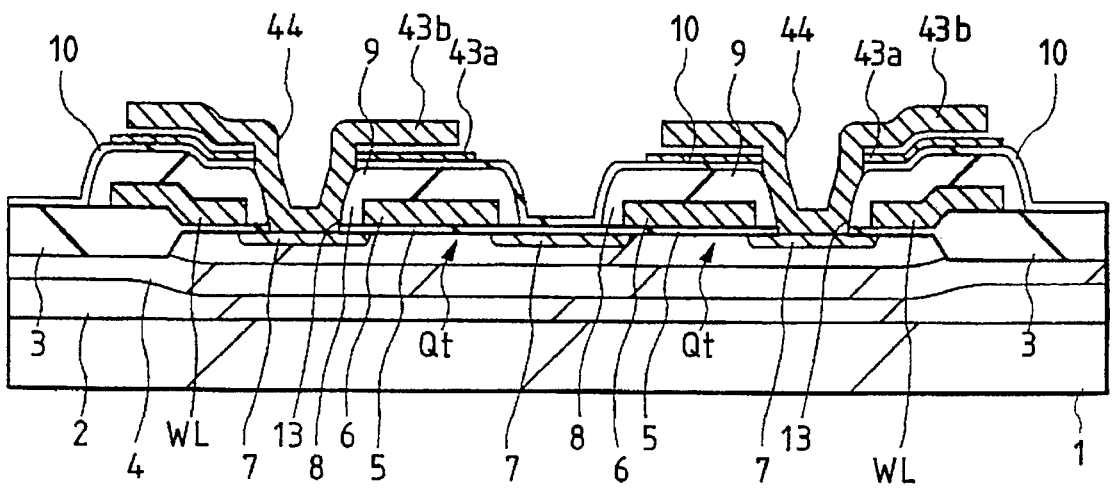
FIG. 37 is a section of an essential portion of the semiconductor substrate and shows a fabrication process of the memory cell of the DRAM according to another embodiment of the present invention.

Next, as shown in FIG. 36, by the dry-etching using the aforementioned photoresist 35 and polymer 36 as the mask, the polycrystalline silicon film 40 below them is patterned to form a lower-layer fin 43a. After this, as shown in FIG. 37, those photoresist 35 and polymer 36 are ashed off to complete the storage electrode 44.

Since the lower-layer fin 43a is formed by the etching method using the photoresist 35 and the polymer 36 as the mask, it is given, as in the foregoing Embodiments 1 and 2, a larger horizontal size than that of the upper-layer fin 43b which is formed by using only the photoresist 35 as the mask. Since, moreover, the clearance between the upper-layer fins 43b of the adjoining memory cells is substantially equal to the minimum working size of that DRAM, the clearance between the lower-layer fins 43a and 43a of the adjoining memory cells is smaller than the minimum working size.

[Embodiment 4]

Next, a process for fabricating a memory cell of the DRAM according to another embodiment of the present invention will be described with reference to FIGS. 38 to 40.

Figure 38:
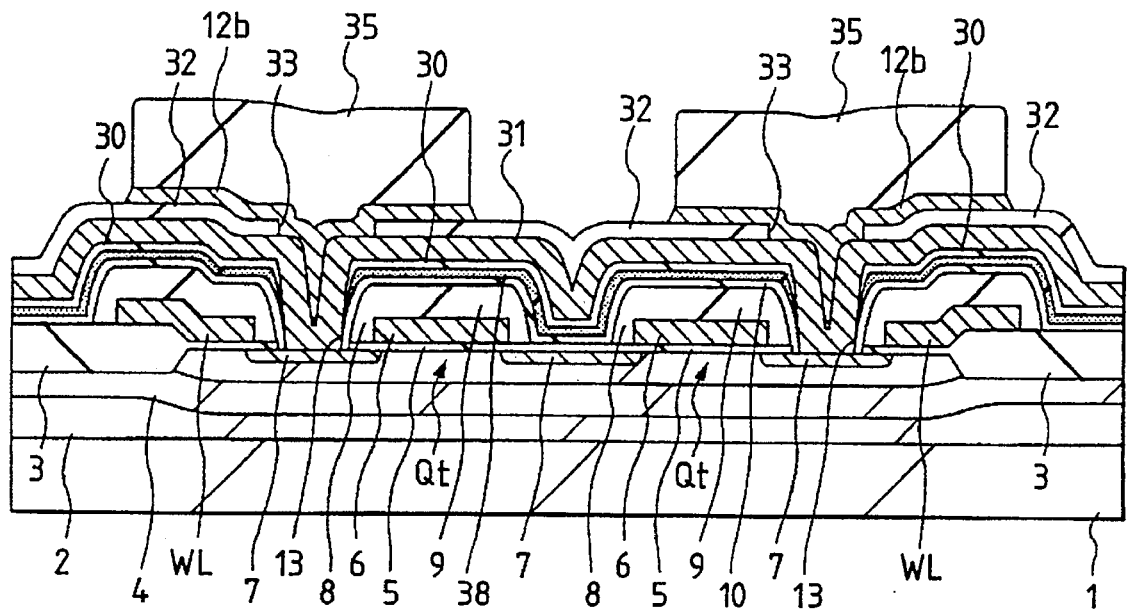
FIG. 38 is a section of an essential portion of the semiconductor substrate and shows a fabrication process of the memory cell of the DRAM according to another embodiment of the present invention.

First of all, as shown in FIG. 38, the third-layered polycrystalline silicon film is patterned to form the upper-layer fin 12b of the storage electrode 11 by the dry-etching method using the photoresist 35 as the mask. This dry-etching method is carried out under the etching condition to taper the side walls of the fin 12b. In order to taper the side walls of the fin 12b, for example, the composition of the process gas is gradually changed when the third-layered polycrystalline silicon film is to be patterned in the processing chamber of the etching apparatus.

Figure 39:
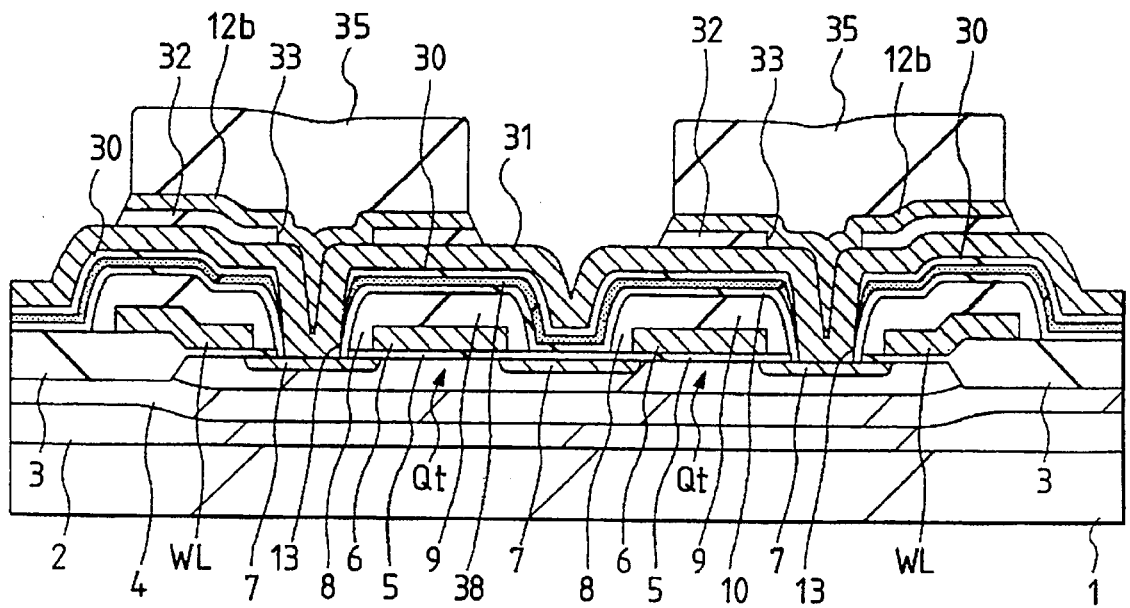
FIG. 39 is a section of an essential portion of the semiconductor substrate and shows a fabrication process of the memory cell of the DRAM according to another embodiment of the present invention.

Next, as shown in FIG. 39, the insulating film 32 below the fin 12b is patterned by the dry-etching method using the aforementioned photoresist 35 and fin 12b as the mask. This dry-etching method is carried out under the etching condition to taper the side walls as in the patterning step of the aforementioned third-layered polycrystalline silicon film.

Figure 40:
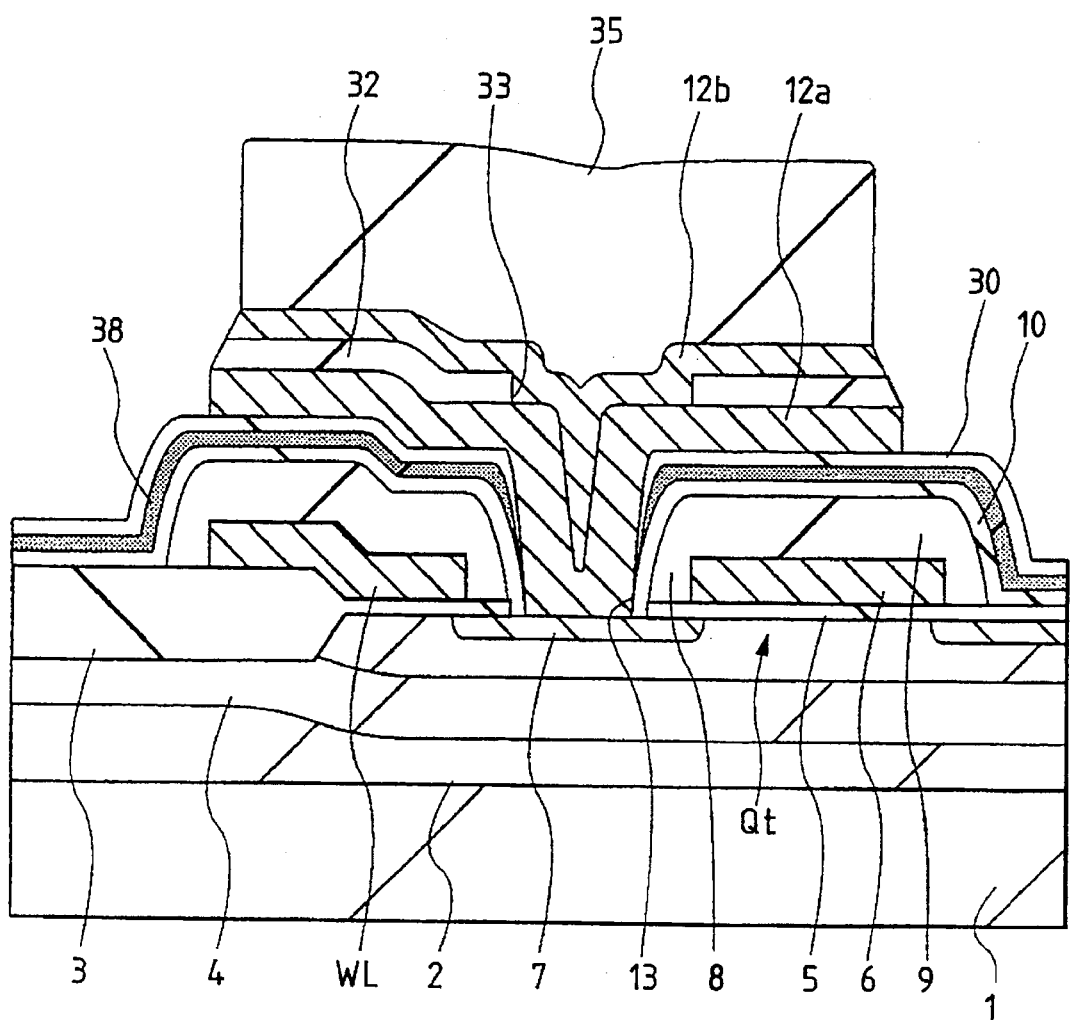
FIG. 40 is a section of an essential portion of the semiconductor substrate and shows a fabrication process of the memory cell of the DRAM according to another embodiment of the present invention.

Next, as shown in FIG. 40, by the dry-etching method using the aforementioned photoresist 35 and insulating film 32 as the mask, the polycrystalline silicon film (31) below them is patterned to form the lower-layer fin 43a. Since this lower-layer fin 43a is formed by the etching method using the photoresist 35 and the insulating film 32 having the tapered side walls as the mask, it is given, as in the foregoing Embodiments 1 to 3, a larger horizontal size than that of the upper-layer fin 43b which is formed by using only the photoresist 35 as the mask. Since, moreover, the clearance between the upper-layer fins 43b of the adjoining memory cells is substantially equal to the minimum working size of the DRAM, the clearance between the lower-layer fins 43a and 43a of the adjoining memory cells is smaller than that minimum working size.

Incidentally, in the present embodiment, the upper-layer fin 12b and the underlying insulating film 32 have their individual side walls tapered, but only one of them may have its side walls tapered. When, moreover, the lower-layer fin 43a is formed by the dry-etching method using the photoresist 35 and the insulating film 32 as the mask, its side walls may be additionally tapered.

Although our invention has been specifically described in connection with its embodiments, it should not be limited thereto but can naturally be modified in various manners within the scope thereof.

Although the foregoing embodiments have been described in case the present invention is applied to the DRAM in which the storage electrode of the information storing capacity element is constructed to have the two-layered fin structure, the present invention should not be limited thereto but can also be applied to the DRAM in which the storage electrode is constructed to have a three or more layered fin structure. In case the storage electrode is constructed of the three-layered fin structure, the clearance between the uppermost fins of the adjoining memory cells is substantially equal to the minimum working size of the memory cells of the DRAM so that the clearance between the second-layered fins is smaller than the minimum working size. Moreover, the clearance between the lowermost fins is made far smaller.

Although the foregoing embodiments have been described in case the present invention is applied to the DRAM in which the bit lines are arranged over the information storing capacity element, the present invention should not be limited thereto but can also be applied to the DRAM of the capacitor over bit line structure, in which the information storing capacity element is arranged over the bit lines.

The effects to be obtained by a representative of the invention disclosed herein will be briefly described in the following.

According to the present invention, the horizontal size of the lower-layer fin of the storage electrode of the DRAM is made larger than that of the upper-layer fin, and the clearance between the lower-layer fin and the lower-layer fin of the adjoining storage electrode is made smaller than the minimum working size of the memory cells of the DRAM. As a result, the storage electrode can have its surface area increased according to the increase in the horizontal size of the lower-layer fin thereby to augment the quantity of stored electric charge of the information storing capacity element.

According to the present invention, moreover, the sizing accuracy of the fins of the storage electrode can be improved by forming the fins by the dry-etching method.

What is claimed is:

1. A process for fabricating a semiconductor integrated circuit device having a plurality of memory cells, each of which comprises: a memory cell selecting MISFET including source and drain regions formed in a semiconductor substrate, and a gate electrode; and an information storing capacity element including a storage electrode having a first conductive film formed over said gate electrode and a second conductive film electrically connected with said first conductive film and positioned over said first conductive film, and electrically connected with one of the source and drain regions of said memory cell selecting MISFET, a dielectric film covering the surface of said storage electrode, and a plate electrode formed over said storage electrode through said dielectric film, comprising:

the step of forming said memory cell selecting MISFET having source and drain regions in said semiconductor substrate;

the step of forming an insulating film over the gate electrode of said memory cell selecting MISFET;

the step of forming said first conductive film over said insulating film;

the step of forming said second conductive film over said first conductive film such that said second conductive film is spaced excepting at least a portion from said first conductive film;

the step of forming a first mask having a first pattern over said second conductive film;

the step of removing said second conductive film of the portion, which is not covered with said first mask, in self-alignment with said first mask;

the step of forming a second mask having a second pattern enlarged in self-alignment with the first pattern of said first mask;

the step of removing said first conductive film of the portion, which is not covered with said second mask, in self-alignment with said second mask;

the step of forming said dielectric film to cover the surface of said storage electrode; and the step of forming said plate electrode over said storage electrode through said dielectric film.

2. A process for fabricating a semiconductor integrated circuit device which an information storing capacity element including a storage electrode having multi-layered fins, a dielectric film cover in the surface of said storage electrode, and a plate electrode formed over said storage electrode through said dielectric film is formed over a memory cell selecting MISFET, comprising the steps of:

(a) depositing a first insulating film over said memory cell selecting MISFET and then etching said first insulating film, to form a first connection hole extending to one semiconductor region of said memory cell selecting MISFET;

(b) depositing a first conductive film over said first insulating film to connect said first conductive film and the one semiconductor region of said memory cell selecting MISFET electrically through said first connection hole;

(c) depositing a second insulating film over said first conductive film and then etching said second insulating film, to form a second connection hole leading to said first conductive film;

(d) depositing a second conductive film over said second insulating film to connect said second conductive film and said first conductive film electrically through said second connection hole;

(e) patterning said second conductive film by using a first mask having a first pattern formed over said second conductive film, to form an upper-layer fin;

(f) patterning said second insulating film so that said second insulating film may have a second pattern extended in self-alignment with said first pattern, to form a second mask;

(g) patterning said first conductive film, which is formed below said second insulating film, in self-alignment with said second mask, to form a lower-layer fin; and (h) etching off said second insulating film, which is left between said upper-layer fin and said lower-layer fin, to form a storage electrode of said information storing capacity element, which has said upper-layer fin and said lower-layer fin.

3. A process for fabricating a semiconductor integrated circuit device according to claim 2, further comprising the step of:

forming an anti-etching film having an etching rate different from that of said first insulating film between said first insulating film and said memory cell selecting MISFET.

4. A process for fabricating a semiconductor integrated circuit device according to claim 2, wherein said first conductive film and said second conductive film are patterned by the dry-etching method.

5. A process for fabricating a semiconductor integrated circuit device according to claim 2, wherein the temperature of said semiconductor substrate is set to 0° C. or a lower level when said second insulating film is patterned by the dry-etching method using a photoresist formed over said upper-layer fin as the mask.

6. A process for fabricating a semiconductor integrated circuit device which an information storing capacity element including a storage electrode having multi-layered fins, a dielectric film covering the surface of said storage electrode, and a plate electrode formed over said storage electrode through said dielectric film is formed over a memory cell selecting MISFET, comprising the steps of:

(a) depositing a first insulating film over said memory cell selecting MISFET and then etching said first insulating film, to form a first connection hole extending to one semiconductor region of said memory cell selecting MISFET;

(b) depositing a first conductive film over said first insulating film to connect said first conductive film and the one semiconductor region of said memory cell selecting MISFET electrically through said first connection hole;

(c) depositing a second insulating film over said first conductive film and then etching said second insulating film, to form a second connection hole leading to said first conductive film;

(d) depositing a second conductive film over said second insulating film to connect said second conductive film and said first conductive film electrically through said second connection hole;

(e) patterning said second conductive film and said second insulating film by using a first mask formed over said second conductive film, to form an upper-layer fin;

(f) depositing a third insulating film over said first mask and then etching said third insulating film to leave said third insulating film on the individual side walls of said upper-layer fin and said second insulating film;

(g) patterning said first conductive film in self-alignment with said third insulating film, to form a lower-layer fin; and (h) etching off said second insulating film, which is left between said upper-layer fin and said lower-layer fin, to form a storage electrode of said information storing capacity element, which has said upper-layer fin and said lower-layer fin.

7. A process for fabricating a semiconductor integrated circuit device which an information storing capacity element including a storage electrode having multi-layered fins, a dielectric film covering the surface of said storage electrode, and a plate electrode formed over said storage electrode through said dielectric film is formed over a memory cell selecting MISFET, comprising the steps of:

(a) depositing a first insulating film, a first conductive film and a second insulating film sequentially over said memory cell selecting MISFET and then etching said second insulating film, said first conductive film and said first insulating film, to form a connection hole extending to one semiconductor region of said memory cell selecting MISFET;

(b) depositing a second conductive film over said second insulating film to connect said second conductive film and the one semiconductor region of said memory cell selecting MISFET electrically through said connection hole;

(c) patterning said second conductive film by using a first mask formed over said second conductive film, to form an upper-layer fin;

(d) etching off said second insulating film from below said upper-layer fin, then depositing a third insulating film over said first mask and subsequently etching said third insulating film, to leave said third insulating film on the individual side walls of said first mask and said upper-layer fin; and (e) patterning said first conductive film in self-alignment with said third insulating film, which is left on the individual side walls of said first mask and said upper-layer fin, to form a lower-layer fin.

8. A process for fabricating a semiconductor integrated circuit device which an information storing capacity element including a storage electrode having multi-layered fins, a dielectric film covering the surface of said storage electrode, and a plate electrode formed over said storage electrode through said dielectric film is formed over a memory cell selecting MISFET, comprising the steps of:

(a) depositing a first insulating film over said memory cell selecting MISFET and then etching said first insulating film, to form a first connection hole extending to one semiconductor region of said memory cell selecting MISFET;

(b) depositing a first conductive film over said first insulating film to connect said first conductive film and the one semiconductor region of said memory cell selecting MISFET electrically through said first connection hole;

(c) depositing a second insulating film over said first conductive film and then etching said second insulating film, to form a second connection hole leading to said first conductive film;

(d) depositing a second conductive film over said second insulating film to connect said second conductive film and said first conductive film electrically through said second connection hole;

(e) patterning said second conductive film to taper its side walls by using a first mask formed over said second conductive film, to form an upper-layer fin;

(f) patterning said second insulating film, which is formed below said upper-layer fin, to taper its side wall in self-alignment with said first mask;

(g) patterning said first conductive film, which is formed below said second insulating film, by using said first mask and said second insulating film as the mask, to form a lower-layer fin; and (h) etching off said second insulating film, which is left between said upper-layer fin and said lower-layer fin, to form a storage electrode of said information storing capacity element, which has said upper-layer fin and said lower-layer fin.

9. A process for fabricating a semiconductor integrated circuit device according to claim 8, wherein said first conductive film is patterned to taper its side wall so as to form said lower-layer fin.

10. A process for fabricating a semiconductor integrated circuit device having a plurality of memory cells, each of which comprises: an information storing capacity element including a storage electrode having at least two conductive layers electrically connected with each other, a dielectric film covering said storage electrode, and a common electrode formed over said storage electrode through said dielectric film; and a memory cell selecting MISFET, comprising the steps of:

(a) forming a gate electrode of said memory cell selecting MISFET over the surface of a semiconductor substrate and first and second semiconductor regions, which form the source region and the drain region of said memory cell selecting MISFET, in said semiconductor substrate at the two sides of said gate electrode;

(b) forming a first conductive film over said semiconductor substrate to form a storage electrode;

(c) depositing a first insulating film over said first conductive film;

(d) depositing a second conductive film over said first insulating film;

(e) patterning said second conductive film by using a first mask formed over said second conductive film, to form a plurality of uppermost conductive layers;

(f) patterning said first insulating film by using said first mask;

(g) forming a second insulating film on the side walls of said patterned first insulating film; and (h) patterning said first conductive film in self-alignment with said second insulating film, wherein said plurality of uppermost conductive layers are worked with the minimum working size.

11. A process for fabricating a semiconductor integrated circuit device having an information storing capacitance element, including a storage electrode having multi-layered fins, provided over a memory cell selecting MISFET, the process comprising the steps of:

forming a first conductive film over a semiconductor substrate of the semiconductor integrated circuit device, including over the memory cell selecting MISFET;

forming a second conductive film over the first conductive film, the second conductive film being spaced from the first conductive film except for a portion that contacts the first conductive film;

selectively removing the second conductive film by using a first mask over said second conductive film, to form an upper-layer fin of said storage electrode;

forming a second mask, in self-alignment with said first mask, said second mask having larger dimensions than said first mask; and selectively removing the first conductive film in self-alignment with said second mask, to form a lower-layer fin of said storage electrode.

12. A process for fabricating a semiconductor integrated circuit device according to claim 11, including the further step of forming a first insulating film over the first conductive film, such that the first insulating film is provided between the first and second conductive films, the first insulating film having a hole therethrough such that the portion of the second conductive film contacts the first conductive film, the first insulating film providing spacing between the first and second conductive films other than at said portion.

13. A process for fabricating a semiconductor integrated circuit device according to claim 12, wherein said first insulating film is selectively removed by using said first mask, and wherein said second mask includes side wall layers on at least sidewalls, of the first insulating film, formed by selective removal of the first insulating film using the first mask.

* * * * *